(12) United States Patent
Choi et al.

(10) Patent No.: US 12,237,180 B2
(45) Date of Patent: Feb. 25, 2025

(54) APPARATUS FOR TREATING SUBSTRATE

(71) Applicant: SEMES CO., LTD., Chungcheongnam-do (KR)

(72) Inventors: Jun Young Choi, Chungcheongbuk-do (KR); Kyu Hwan Chang, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 565 days.

(21) Appl. No.: 17/539,070

(22) Filed: Nov. 30, 2021

(65) Prior Publication Data
US 2022/0172966 A1    Jun. 2, 2022

(30) Foreign Application Priority Data

Nov. 30, 2020    (KR) .................. 10-2020-0164371
Jun. 30, 2021    (KR) .................. 10-2021-0085966

(51) Int. Cl.
*H01L 21/67*      (2006.01)
*B08B 7/00*      (2006.01)

(52) U.S. Cl.
CPC ...... *H01L 21/67051* (2013.01); *B08B 7/0021* (2013.01); *H01L 21/67057* (2013.01)

(58) Field of Classification Search
CPC .......... H01L 21/6704; H01L 21/67051; H01L 21/67057; H01L 21/67155; H01L 21/67173; H01L 21/67718; H01L 21/6773; H01L 21/67739; H01L 21/67757; H01L 21/67778; H01L 21/67781

See application file for complete search history.

(56) References Cited

U.S. PATENT DOCUMENTS

| 8,944,078 B2 | 2/2015 | Kamikawa |
| 9,004,079 B2 | 4/2015 | Kamikawa |
| 2003/0164179 A1 | 9/2003 | Kamikawa et al. |
| 2004/0040660 A1 | 3/2004 | Biberger et al. |
| 2008/0166208 A1 | 7/2008 | Lester et al. |
| 2010/0173495 A1 | 7/2010 | Thakur et al. |
| 2015/0332940 A1* | 11/2015 | Wang ............... H01L 21/67781 134/25.1 |
| 2020/0168482 A1 | 5/2020 | Inadomi et al. |

(Continued)

FOREIGN PATENT DOCUMENTS

| CN | 1805126 A | 7/2006 |
| JP | 2005509280 A | 4/2005 |
| JP | 2006179757 A | 7/2006 |

(Continued)

OTHER PUBLICATIONS

Machine Translation of Kusuhara et al., WO-2010082567-A1, Jul. 2010. (Year: 2010).*

*Primary Examiner* — David G Cormier
(74) *Attorney, Agent, or Firm* — Procopio, Cory, Hargreaves & Savitch LLP

(57) ABSTRACT

The inventive concept provides a substrate treating apparatus. The substrate treating apparatus comprises a first treating part performing, a liquid treatment on a plurality of substrates in a batch-type treating, method and a second treating part treating the substrates which have been treated at the first treating part, and performing, the liquid treatment or a drying treatment on a single substrate a single-type treating method.

16 Claims, 15 Drawing Sheets

(56) References Cited

U.S. PATENT DOCUMENTS

2020/0203193 A1    6/2020  Nam et al.
2021/0111038 A1*  4/2021  Kanagawa ........ H01L 21/67173

FOREIGN PATENT DOCUMENTS

| | | |
|---|---|---|
| JP | 2006261546 A | 9/2006 |
| JP | 3939178 B2 | 4/2007 |
| JP | 2011222676 A | 11/2011 |
| JP | 5477131 B2 | 2/2014 |
| JP | 5494146 B2 | 3/2014 |
| JP | 2016502275 A | 1/2016 |
| KR | 1019980029388 A | 7/1998 |
| KR | 1020040037245 A | 5/2004 |
| KR | 101489314 B1 | 2/2015 |
| KR | 101568450 B1 | 11/2015 |
| KR | 101596064 B1 | 2/2016 |
| KR | 1020170113354 A | 10/2017 |
| KR | 1020200060280 A | 5/2020 |
| KR | 1020210043445 A | 4/2021 |
| KR | 1020220044108 A | 4/2022 |
| TW | 201732989 A | 9/2017 |
| WO | 2004070805 A1 | 8/2004 |
| WO | WO-2010082567 A1 * | 7/2010 ........... B28D 5/0082 |

* cited by examiner

APPARATUS FOR TREATING SUBSTRATE

CROSS-REFERENCE TO RELATED APPLICATIONS

A claim for priority under 35 U.S.C. § 119 is made to Korean Patent Application Nos. 10-2020-0164371 and 10-2021-0085966 filed on Nov. 30, 2020 and Jun. 30, 2021, respectively, in the Korean Intellectual Property Office, the entire contents of which are hereby incorporated by reference.

BACKGROUND

The exemplary embodiments of the inventive concept described herein relate to an apparatus for treating a substrate.

Various processes such as a photolithography process, an etching process, an ashing process, an ion implantation process, and a thin film deposition process are carried out to manufacture a semiconductor device. At each of the processes, various treating liquids and treating gases are used and during treating process, particles and process by-products are generated. To remove such thin films, particles, and process by-products, a liquid treatment is performed before and after each of the processes. In a conventional liquid treatment process, the substrate is treated with chemicals and a rinsing liquid before a drying treatment. The liquid treatment process may strip a SiN from the substrate.

Furthermore, the method of treating a substrate with a chemical and a rinsing liquid may be largely divided into a batch-type treating method of collectively treating a plurality of substrates, and a single-type treating method of treating one substrate at a time respectively.

In the batch-type treating method for collectively treating a plurality of substrates, the substrate treatment is performed by collectively immersing a plurality substrates in a treating bath in which the chemical or the rinsing liquid is stored in a vertical posture. For this throughput of the substrate treatment is outstanding, and the treating quality between each substrate is uniform. However, in the batch-type treating method, a plurality of the substrates having patterns on the top surface thereof are immersed in a vertical posture. According, when the patterns on the substrate have a high aspect ratio, as pattern leaning phenomenon may occur during a process such as lifting the substrate. In addition if the drying treatment is not performed within a short time after the plurality of the substrates are exposed to the air, a water park may be generated on some of the plurality of substrates exposed to the air.

On the other hand, in the case of a single-type treating method treating the substrate one by one, the substrate treatment is performed by supplying the chemical or the rinse liquid to a single substrate rotating in a horizontal posture. In addition, in the single-type treating method the risk of the pattern leaning described above is low because the transferred substrate maintains a horizontal posture, and the risk of occurrence of the aforementioned watermark is low because the substrate is dry treated, or liquid treated immediately after treatment one by one. However, in the case of the single-type treating method, the throughput of the substrate treatment is poor, and the treating quality between each substrate is relatively uneven compared to the batch-type treating method.

In addition, when the substrate is rotated and spin-dried, if the pattern formed on the substrate as a high aspect ratio, there is a concern that a leaning phenomenon, in which the pattern on the substrate collapses, may occur.

SUMMARY

Embodiments of the inventive concept provide a substrate treating apparatus for efficiency treating a substrate.

Embodiments of the inventive concept provide a substrate treating apparatus which can improve throughput of substrate treatment.

Embodiments of the inventive concept provide a substrate treating apparatus which can improve a uniformity of a treating quality between each substrate.

Embodiments of the inventive concept provide a substrate treating apparatus for minimizing a risk of a watermark occurring on the substrate.

Embodiments of the inventive concept provide a substrate treating apparatus for minimizing a risk of a pattern leaning phenomenon occurring on the substrate.

Embodiments of the inventive concept provide a substrate treating apparatus for efficiently treating a substrate with a pattern having a high aspect ratio.

The technical objectives of the inventive concept are not limited to the above-mentioned ones, and the other unmentioned technical objects will become apparent to those skilled in the art from the following description.

An embodiment of the inventive concept provides a substrate treating apparatus. The substrate comprises: a first treating part performing a liquid treatment on a plurality or substrates in a batch-type treating method; a second treating part treating the substrates which have been treated at the first treating part, and performing the liquid treatment or a drying treatment on a single substrate in a single-type treating method.

In an embodiment, the first treating part comprises a first load port unit on which a container storing an untreated substrate is placed; and the second treating part comprises a second load port unit on which a container storing a treated substrate is placed.

In an embodiment, the first treating part comprises a batch-hand transferring a plurality of substrates transferred from the container placed on the first load port unit; and the second treating, part comprises a single-hand transferring a single substrate which has been liquid treated at the first treating part.

In an embodiment, the second treating part comprises: a single-type treating chamber performing the liquid treatment or the drying treatment on the substrate in the single-type treating method; and a second buffer unit placed between the single-type treating chamber and the second load port unit and temporarily storing a substrate which has been treated at the single-type treating chamber.

In an embodiment, the second treating part comprises: a single-type treating chamber performing the liquid treatment or the drying treatment on the substrate in the single-type treating method; and a first buffer unit placed between the first treating part and the single-type treating chamber and temporarily storing a substrate which has been treated at the first treating part.

In an embodiment, the first treating part comprises: a treating bath having a containing space to contain a treating liquid; a storage container submerged in the treating liquid contained in the containing, space and having a storage space for storing the substrates; and a posture changing member rotating the storage container submerged in the treating liquid.

In an embodiment, the posture changing member comprises: a rotation unit installable on the storage container and rotating the storage container; and a moving unit installed at the treating bath and moving the storage container installed on the rotation unit in a horizontal direction.

In an embodiment, the treating bath has a container-shape with an open top, and the moving unit is installed at a side of the treating bath.

In an embodiment, the moving unit has a "⊂" shape with the opened part facing the bottom so that the moving unit may be installed at a side of the treating bath.

In an embodiment, the first treating part further comprises a lifting/flowering member to move the storage container rotated by the posture changing member in an up/down direction, and the lifting/lowering member is attachable/removable to/from the storage container.

In an embodiment, the second treating part comprises a first buffer unit for temporarily storing a substrate which has been liquid treated at the first treating part; and the apparatus further comprises a transfer unit for transferring the substrate between the storage container and the first buffer unit.

In an embodiment, the substrate support unit further comprises a controller configured to control the transfer unit, and the lifting/lowering member to upwardly move the storage container so that the substrate exposed to the outside may be transferred to the first buffer unit.

In an embodiment, the substrate support unit further comprises a controller configured to control the transfer unit so that the topmost substrate among the substrates stored at the storage container is transferred from the storage container and transferred to the first buffer unit.

In an embodiment, the controller controls the lifting/lowering member to move the storage container in an upward direction after the topmost substrate among the substrates is transferred from the storage container, so subsequent topmost substrate among the substrates stored in the storage container is exposed to the outside.

An embodiment of the inventive concept provides a substrate treating apparatus. The substrate comprises: a batch-type treating chamber for performing a cleaning treatment on a plurality of substrates in a batch-type treating method; a single-type treating chamber for treating the substrates treated in the batch-type treating chamber, and performing a drying treatment on a single substrate in a single-type treating method; and a transfer unit transferring the substrate between the batch-type treating chamber and the single-type treating chamber.

In an embodiment, the batch-type treating chamber comprises: a treating bath having a containing space to contain a treating liquid; and a posture changing member submerged in the treating liquid contained in the containing space and rotating the storage container having a storage space storing the substrates.

In an embodiment, the posture changing member comprises: a rotation unit installable to the storage container and rotating the storage container; and a moving unit installed at the treating bath and moving the storage container installed to the rotation unit in a horizontal direction.

In an embodiment, the batch-type treating chamber further comprises a lifting/lowering member moving in an up/down direction the storage container rotated by the posture changing member.

An embodiment of the inventive concept provides a substrate treating apparatus. The substrate comprises: a first treating part performing a liquid treatment on a plurality of substrates in a batch-type treating method; and a second treating part performing a drying treatment on a single substrate in a single-type treating method, wherein the first treating part comprises: a first load port unit loading only untreated substrates; a batch-type treating chamber performing a cleaning treatment on the plurality of substrates in a batch-type treating method; a first transfer module with a batch-hand transferring the plurality of substrates from the first load port unit to the batch-type treating chamber; and a first buffer unit placed between the batch-type treating chamber and the second treating part and temporarily storing the substrates, wherein the second treating part comprises a single-type treating chamber performing drying treatment on a single substrate; a second transfer module with a single-hand transferring the substrates from the first buffer unit to the single-type treating chamber; and a second load port unit unloading the substrate processed at the single-type treating chamber.

In an embodiment, the single-type treating chambers are provided in a plurality, and at least somite of the single-type treating chambers are placed stacked with the first buffer unit, and at least some other of the single-type treating chambers are placed stacked one above another.

According to an embodiment of the inventive concept, the substrate may be treated efficiently.

According to an embodiment of the inventive concept, the mass producing of the substrate treatment may be improved.

According to an embodiment of the inventive concept, uniformity of a treating quality between each substrate may be improved.

According to an embodiment of the inventive concept, a risk of a watermark occurring on the substrate may be minimized.

According to an embodiment of the inventive concept, a risk of a pattern leaning phenomenon occurring on the substrate may be minimized.

According to an embodiment of the inventive concept, a substrate with a pattern formed having a high aspect ratio may be efficiently treated.

The effects of the inventive concept are not limited to the above-described effects, and effects not mentioned will be clearly understood by those skilled in the art from the present specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
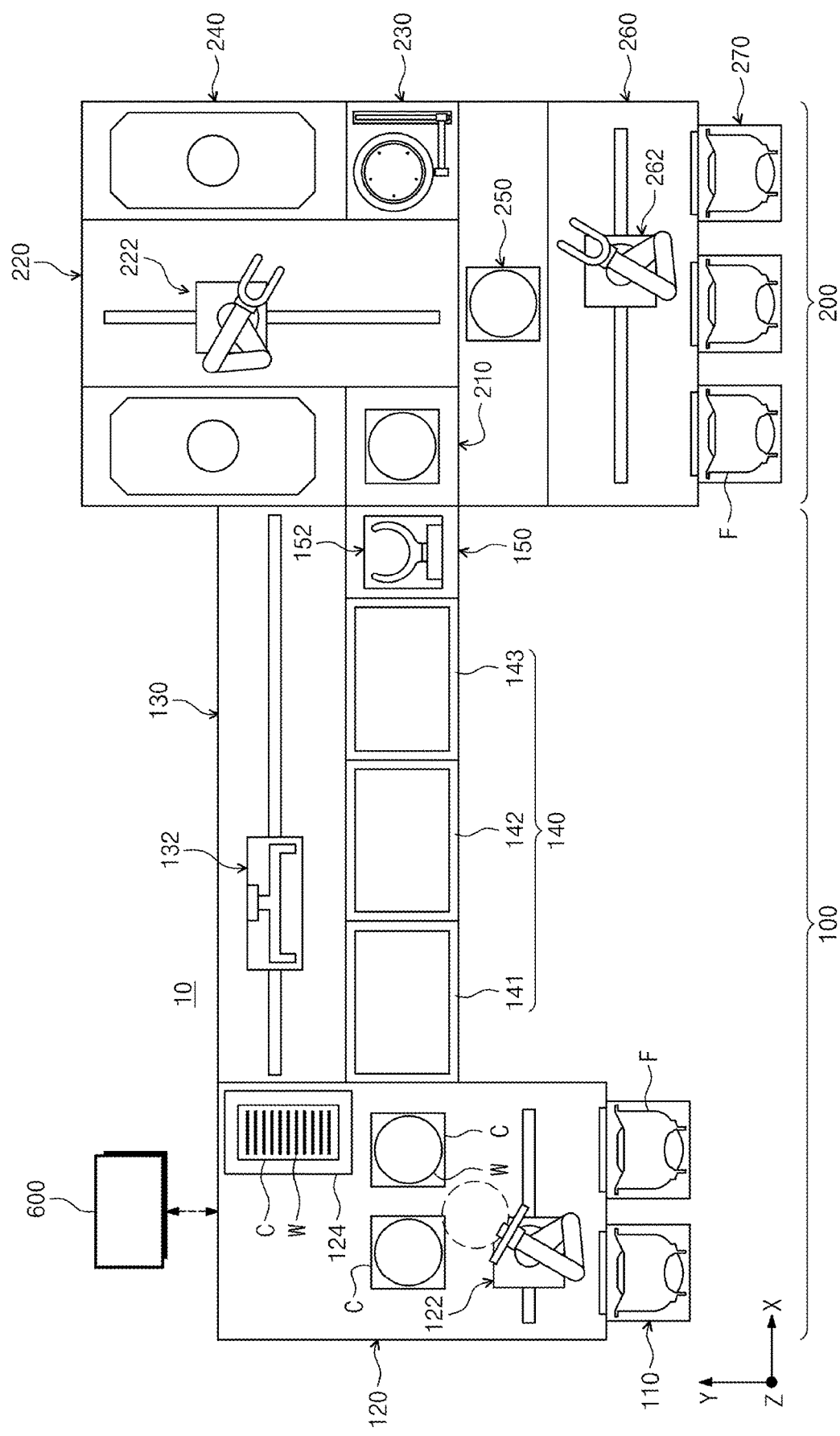
FIG. 1 is a schematic view of a substrate treating apparatus according to embodiment of the inventive concept viewed from above.

The inventive concept may be variously modified and may have various thrills, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not attended to be limiting of the inventive concept. As used, herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and an combinations of one or more of the associated listed items. Also, the term "exemplary" is intended to refer to an example or illustration.

Singular expressions include plural expressions unless they explicitly have a different meaning in the context. In addition, the shape and size of the elements in the drawings may be exaggerated for clearer explanation.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It will be understood that when an element or component is referred to as being "on", "connected to", "coupled to", or "adjacent to" another element or component, it can be directly on, connected, coupled, car adjacent to the other element or component, or intervening elements or components may be present. In contrast, when an element is referred to as being "directly on," "directly connected to", "directly coupled to", or "immediately adjacent to" another element or component, there are no intervening elements or components present. Other expression explaining, the relationship between elements such us when an element is referred to as being "between" another two elements, it can be directly between another two elements or indirectly between another two elements.

Unless otherwise defined, all terms used herein, including technical or scientific terms, have the same meaning as those generally understood by those skilled in the art to which the inventive concept belongs. Terms stitch as those defined in commonly used dictionaries should be interpreted as consistent with the context of the relevant technology and not as ideal or excessively formal unless clearly defined in this application.

In addition, components for transferring a substrate W which will be described below, such as a transfer unit or transfer robots in the following, may be referred to as a transfer module.

Hereinafter, an embodiment of the inventive concept will be described with reference to FIG. 1 to FIG. 16.

Figure 2:
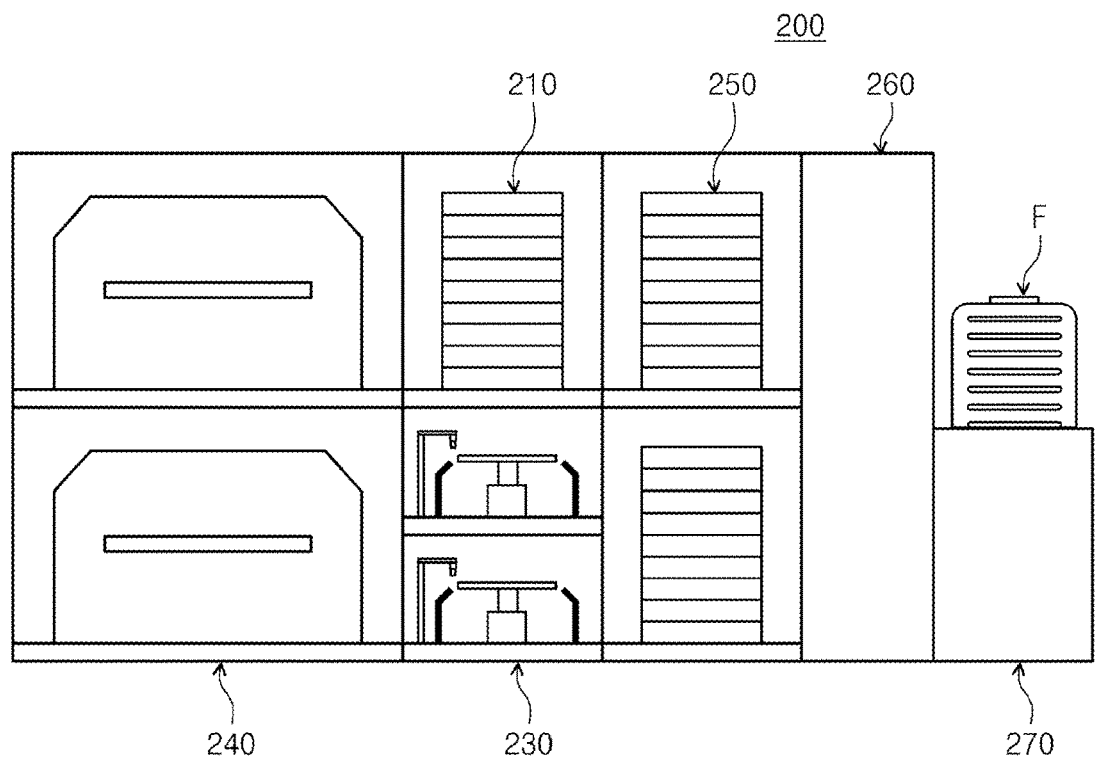
FIG. 2 is a side view of a second treating part of FIG. 1 viewed from one direction.
Figure 3:
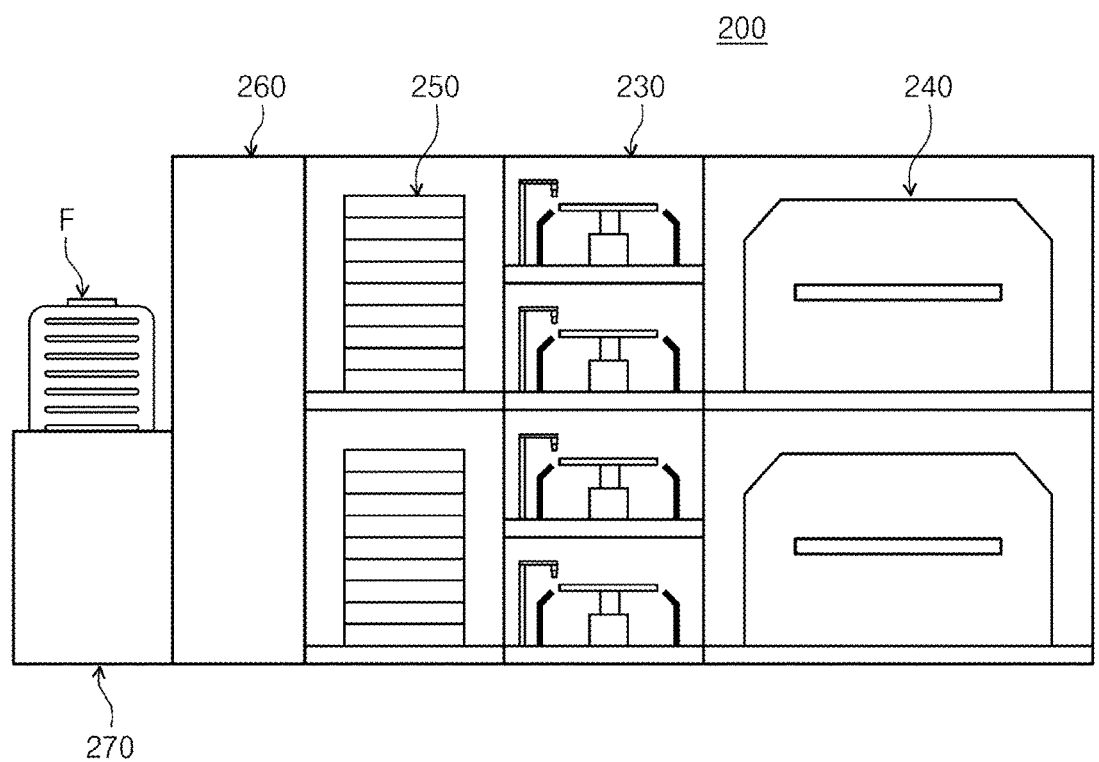
FIG. 3 is a side view of the second treating unit of FIG. 1 viewed from another direction.

FIG. 1 illustrates a substrate treating apparatus according to an embodiment of the inventive concept viewed from above, FIG. 2 illustrates a second treating part of FIG. 1 viewed from one direction, and FIG. 3 illustrates the second treating part of FIG. 1 viewed from another direction.

Referring to FIG. 1, FIG. 2, and FIG. 3, a substrate treating apparatus 10 according to an embodiment of the inventive concept may include a first treating part 100, a second treating part 200, and a controller 600. The first treating unit 100 and the second treating part 200 may be arranged along a first direction X when viewed from above. Hereinafter, a direction perpendicular to the first direction X is referred to as a second direction Y, and a direction perpendicular to the first direction X and the second direction Y is referred to as a third direction Z.

The first treating part 100 may collectively liquid-treat a plurality of substrates W in a batch-type method. For example, the first treating part 100 may collectively clean-treat a plurality of substrates W in a batch-type method. The first treating part 100 may include a first load port unit 110, a first index chamber 120, a first transfer chamber 130, a batch-type liquid treating chamber 140, and a second transfer chamber 150.

The first load port unit 110 may include at least one load port. A container F in which at least one substrate W is stored may be placed in the load ports of the first load port unit 110. A plurality of substrates W may be stored in the container F. For example, 25 substrates may be stored in the container F. The container F may be referred to as a cassette, a POD, a FOUP (Front Opening Unified Pods), or the like. The container F may be loaded into the first load port unit 110 by a container transfer device. The substrates W stored in the container F placed on the first load port unit 110 may be untreated substrates W or substrates W requiring liquid treatment (wafer to be liquid-treated). In addition, only the container F in which the untreated substrate W stored may be placed in the first load port unit 110. That is, the first load port unit 110 may serve to load the substrate W requiring treating.

The first load port unit 110 may be coupled to the first index chamber 120. The first index chamber 120 and the first load port unit 110 may be arranged in the second direction Y. The first index chamber 120 may include a first transfer robot 122 and a posture changing unit 124. The first transfer robot 122 may take out an untreated or treatment requiring substrate (wafer to be treated) W from the container seated on the first load port unit 110. The first transfer robot 122 may take the substrate W out of the container F and bring the substrate W into the storage container C provided in the first index chamber 120. The first transfer robot 122 may have a batch-hand capable of simultaneously gripping and transferring a plurality of substrates (e.g., 25 wafers).

The storage container C may be a substantially container shape. The storage container C may have a storage space therein. A plurality of the substrates W may be stored in the storage space of the storage container C. For example, 50 substrates W may be stored in the storage space of the storage container C. The storage container C may have a container with one open side. A support member for supporting/retaining the substrate W may be provided in the storage space of the storage container C.

When the substrate W taken out from the container F is completely brought into the storage container C, the storage container C may be returned to the posture changing unit 124 disposed in the first index chamber 120. The posture change unit 124 may rotate the storage container C. For example, the posture changing unit 124 may rotate the storage container C such that the open side of the storage container C faces upward. When the storage container C rotates such that open side of the storage container C face upward, the posture of the substrate W stored in the storage container (C) may be changed from a horizontal posture to a vertical posture. The horizontal posture may mean a state in which a top surface of the substrate W (e.g., the surface in which a pattern is formed) is parallel to the X-Y plane, and the vertical posture may mean a state in which the top surface of the substrate W is parallel to the X-Z plane or the Y-Z plane.

A first transfer chamber 130 may be connected to the first index chamber 120. The first transfer chamber 130 may include a first transfer unit 132. The first transfer unit 132 may include a transfer hand capable of transferring an object. In addition, the transfer hand of the first transfer unit 132 may be provided to be movable along the first direction X, the second direction Y, and the third direction Z. In addition, the transfer hand of the first transfer unit 132 may be provided to be rotatable about the third direction Z as a rotation axis. The first transfer unit 132 may take out at least one substrate W from the first index chamber 110 and insert the same into a batch-type liquid treating chamber 140 to be described later. For example, the first transfer unit 132 may take a plurality of substrates W out of the first index chamber 120 at once and put them into a batch-type liquid treating chamber 140 to be described later. For example, the hand of the first transfer unit 132 may take out the storage container C rotated by the posture changing unit 124 from the first index chamber 120 and bring the taken-out storage container C into, the batch-type liquid treating chamber 140.

The batch-type liquid treating chamber 140 may be disposed in parallel with the first transfer chamber 130 when viewed from above.

The batch-type liquid treating chamber 140 may liquid-treat a plurality of substrates W at once. The batch-type liquid treating chamber 140 may clean a plurality of substrates W at once using the treating liquid. The batch-type liquid treating chamber 140 may liquid-treat a plurality of substrates W at once using the treating liquid. The treating liquid used in the batch-type liquid treating chamber 140 may be a chemical and/or rinsing liquid. For example, the chemical may be a chemical with a strong acid or strong alkali properties. In addition, the rinsing liquid may be pure water. For example, the chemical may be selected from APM (Ammonia-Hydrogen Peroxide Mixture), HPM (Hydrochloricacid-Hydrogen Peroxide Mixture), FPM (Hydrofluoricacid-Hydrogen Peroxide Mixture), DHF (Diluted Hydrofluoric Acid), a chemical removing SiN, a chemical including phosphoric acid, or a chemical including sulfuric acid. The rinsing liquid may be appropriately selected from pure water or ozone water, etc.

In addition, the batch-type liquid treating chamber 140 may include a first batch-type liquid treating chamber 141, a second batch-type liquid treating chamber 142, and a third batch-type liquid treating chamber 143. The first batch-type liquid treating chamber 141 and the second batch-type liquid treating chamber 142 may treat the substrate W using a chemical. The third batch-type liquid treating chamber 143 may rinse-treat the substrate W using a rinsing liquid. In addition, after treating the substrate W in the first batch-type liquid treating chamber 141 and/or the second batch-type liquid treating chamber 142, the above-described first transfer unit 132 may return the storage container C containing substrates which have been chemical-treated to the third batch-type liquid treating chamber 143 to treat the substrate W stored in the storage container C with a rinsing liquid. Details of the batch-type liquid treating chamber 140 will be described later.

When viewed from above, the second transfer chamber 150 may be arranged in parallel with the first transfer chamber 130 and the batch-type liquid treating chamber 140. For example, the second transfer chambers 150 may be arranged in parallel with the first transfer chamber 130 in the second direction Y. In addition, the second transfer chamber 150 may be arranged in parallel with the batch-type liquid treating chamber 140 in the first direction X. In addition, the second transfer chamber 150 may be disposed between the third batch-type liquid treating chamber 143 and the second treating part 200. For example the second transfer chamber 150 may be disposed between the third batch-type liquid treating chamber 143 and a first buffer unit 210 of the second treating part 200 to be described later.

The second transfer chamber 150 may transfer the substrate W. The second transfer chamber 150 may take out the substrate W from the batch-type liquid treating chamber 140 and return the substrate W to the first buffer unit 210 to be described later. The second transfer chamber 150 may include a second transfer unit 152 having a transfer hand. The transfer hand of the second transfer unit 152 may be provided to be movable along the first direction X, the second direction Y, and the third direction Z. In addition, the transfer hand of the second transfer unit 152 may be provided to be rotatable about the third direction Z as an axis. In addition, the transfer hand of the second transfer unit 152 may take out the substrate W from the third batch-type liquid treating chamber 143 included in the batch-type liquid treating chamber 140 and transfer the substrate W to the first buffer unit 210. In addition, the transfer band of the second transfer unit 152 may take out the substrate W in a horizontal posture from the third batch-type liquid treating chamber 143 and transfer the same to the first buffer unit 210.

The second treating part 200 may treat the substrate W which has been treated by the first treating part 100. The second treating part 200 may treat the substrate W which has been treated by the first treating part 100, and may perform a single-type liquid treatment or a single-type drying treatment on the substrate W. The second treating part 200 may include the first buffer unit 210, a third transfer chamber 220, a single-type liquid treating chamber 230, a drying chamber 240, a second buffer unit 250, a second index chamber 260, and a second load port unit 270. Both the single-type liquid treating chamber 230 and the drying chamber 240 may be referred to as a single-type treating chamber.

When viewed from above, the first buffer unit 210 may be arranged in parallel with the second transfer chamber 150 in the first direction X. For example, the first buffer unit 210 may be disposed on one side of the second transfer chamber 150. The first buffer unit 210 may have a storage space for temporarily storing substrates W which have been liquid-treated in the cast treating part 100. The first buffer unit 210 may store substrates W in a horizontal posture whose position has been changed from a vertical position in a third batch-type liquid treating chamber 143. In addition, a liquid supply line supplying a wetting liquid to the storage space may be connected to the first buffer unit 210 so as to prevent the substrate W brought into the storage space from drying (to maintain wettability of the substrate W). In addition, the substrates W stored in the first buffer unit 210 may be stored in respective storage spaces independently partitioned within the first buffer unit 210. In addition, the first buffer unit 210 may be disposed to be stacked with at least some of the single-type treating chambers. For example, the drying chamber 240 or the single-type liquid treating chamber 230 to be described later may be disposed under the first buffer unit 210. For example, the single-type liquid treating chamber 230 to be described later ay be disposed under the first buffer unit 210. One or a plurality of single-type liquid treating chambers 230 may be disposed under the first buffer unit 210.

When viewed from above, the third transfer chamber 220 may be disposed between the drying chambers 240 to be described later. In addition, the third transfer chamber 220 may be disposed between first buffer unit 210 and the single-type liquid treating chamber 230 to be described inter when viewed from above. The third transfer chamber 220 may include a third transfer unit 222. The third transfer unit 222 may include a transfer hand that takes out the substrate W from the first buffer unit 210 and transfers the substrate W to the drying chamber 240 or the single-type liquid treating chamber 230. The hand of the third transfer unit 220 may be a single-type hand that transfers one substrate at a time. The transfer hand of the third transfer unit 222 may be provided to be movable along the first direction X, the second direction Y, and the third direction Z. In addition, the transfer hand of the third transfer unit 222 may be provided rotatable about the third direction Z as a rotation axis.

The single-type liquid treating chamber 230 may be disposed on one side and on another side of the third transfer chamber 220 when viewed from above. Some of the single-type liquid treating chambers 230 may be disposed to be stacked with the first buffer unit 210 as described above. Some of the single-type liquid treating chambers 230 may be disposed below the first buffer unit 210.

The single-type liquid treating chamber 230 rotates the horizontal posture-substrate W, and supplies the treating liquid to the rotating substrate W in the horizontal posture to treat the substrate W. The substrate W may be processed one at a time at the single-type liquid treating chamber 230. The treating liquid supplied from the single-type liquid treating chamber 230 may be an organic solvent. For example, the treating liquid supplied from the single-type liquid treating chamber 230 may be isopropyl alcohol (IPA). The single-type liquid treating chamber 230 may supply an organic solvent to the rotating substrate W, and rotate the substrate W to thy-treat the substrate W. Alternatively, the single-type liquid treating chamber 230 supplies an organic solvent to the rotating substrate W, and the substrate W is returned to the drying chamber 240 to be described later while wetted with the organic solvent, so that the substrate W may be dried in the drying chamber 240. The single-type liquid treating chamber 230 will be described later in detail.

The drying chamber 240 may process the substrate W using a supercritical fluid. The drying chamber 240 may be a supercritical chamber for drying one substrate W in a single-type manner. The drying chamber 240 may be a supercritical chamber for drying the substrate W using a supercritical fluid. The drying chamber 240 will be described later in detail.

The second buffer unit 250 may be disposed between the third transfer chamber 230 and the second index chamber 260 to be described later. The second buffer unit 250 may be disposed between the single-type treating chamber and the second load port unit 270.

Similar to the first buffer unit 210, the first buffer unit 250 may provide a space in which the substrate W is temporarily stored, or stayed. For example, the second buffer unit 250 may temporarily store the substrate W which has been treated in the single-type liquid treating chamber 230 and/or the drying chamber 240.

The second index chamber 260 may be arranged in a line with the second buffer unit 250 and the third transfer chamber 220. The second index chamber 260 may be arranged in a line with the second buffer unit 250 and the third transfer chamber 220 in the second direction Y. The third transfer unit 222 of the third transfer chamber 220 may carry out the substrate W in the horizontal posture which has been treated by the single type liquid treating chamber 230 or the drying chamber 240 and may transfer the carried-out substrate W to the second buffer unit 250. The second transfer robot 262 of the second index chamber 260 may take out the substrate W from the second buffer unit 250.

The hand of the second transfer robot 262 may be a single-type hand that transfers one substrate at a time. The transfer hand of the second transfer robot 262 may be provided to be movable along the first direction X, the second direction Y, and the third direction Z. In addition, the transfer hand of the second transfer robot 262 may be provided rotatable about the third direction Z as a rotation axis.

The second load port unit 270 may include at least one load port. A container F for storing a plurality of substrates W may be disposed in a load port of the second load port unit 270. For example, the container F placed on the second load port unit 270 may store substrates W that have been treated in the first treating part 100 and the second treating part 200. In the container F placed on the second load port unit 270, only the substrate W that has been treated in the first treating part 100 and the second treating part 200 may be stored. That is, the second load port unit 270 may perform a function of unloading the treated substrate W from the substrate treating apparatus.

The above-described second transfer robot 262 may bring the treated substrate W into the container F placed in the load port of the second load port unit 270. The container F may be returned to the outside of the substrate treating apparatus 10 by the above-described article transfer apparatus (e.g., OHT, Overhead Transport Apparatus).

The controller 600 may control the substrate treating apparatus 10. For example, the controller 600 may control components of the substrate treating apparatus 10. For example, the controller 600 may control the substrate treating apparatus 10 so that the substrate treating apparatus 10 may perform a process of treating the substrate W. For example, the controller 600 may control the batch-type liquid treating chamber 140, the second transfer unit 152, the first buffer unit 210, the third transfer unit 222, and the second transfer robot 262. In addition, the controller 600 may control a liquid supply source 315, a liquid discharge line 316, a posture changing member 330, a lifting/lowering member 340, and a heating member 320 to be described later.

In addition, the controller 600 may comprise a process controller consisting of a microprocessor (computer) that executes control of substrate treating apparatus 10, a user interface such as a keyboard via which an operator inputs commands to manage the substrate treating apparatus 10 and a display showing the operating situation of the substrate treating apparatus 10, and a memory unit storing a treating recipe, i.e., a control program to execute treating processes of the substrate treating apparatus 10 by controlling the process controller or a program to execute components of the substrate treating apparatus 10 according to data and treating condition. In addition, the user interface and the memory unit may be connected to the process controller. The treating recipe may be stored in a storage medium of the storage unit, and the storage medium may be a hard disk, a portable disk such as a CD-ROM, a DVD, or a semiconductor memory such as a flash memory.

Figure 4:
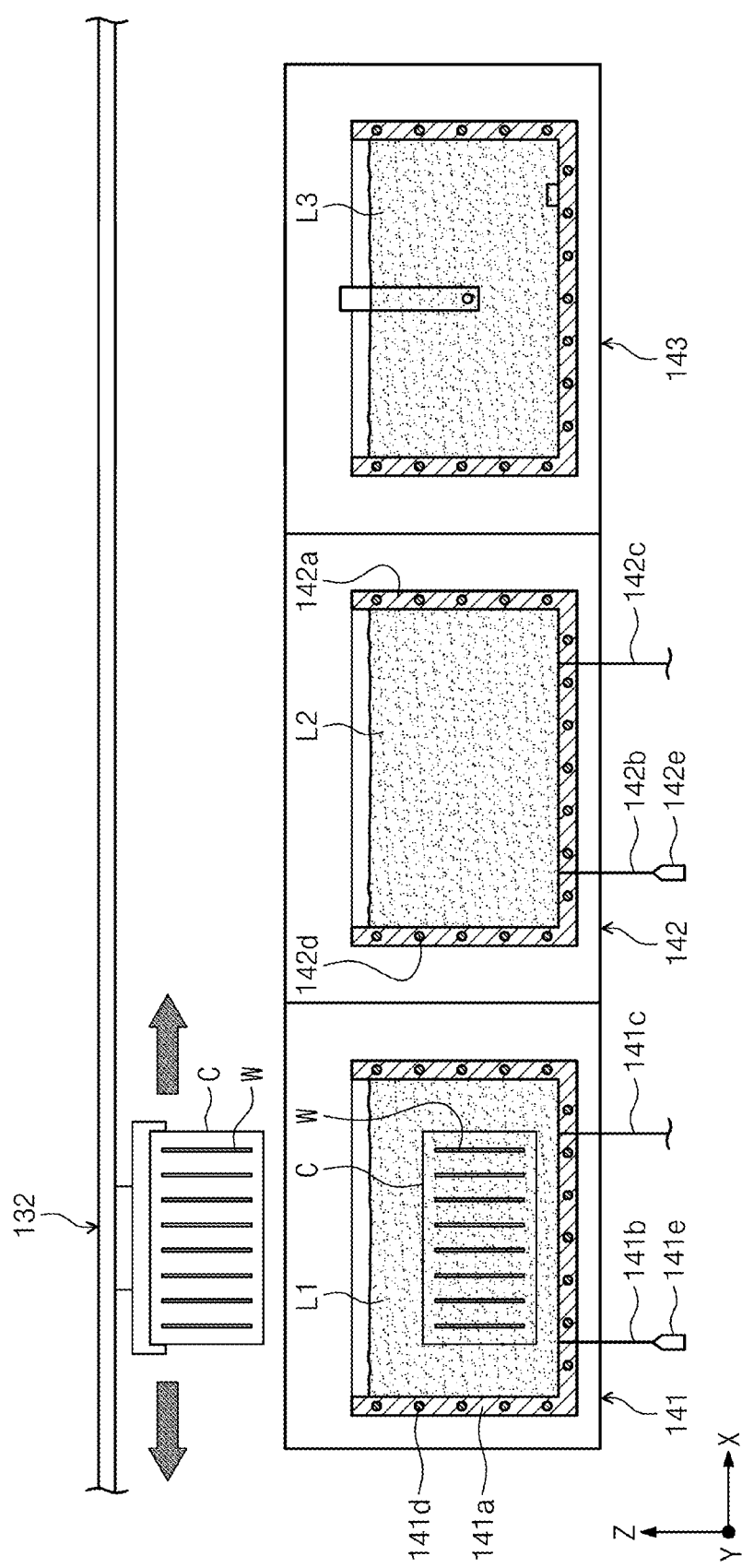
FIG. 4 is a schematic view of a batch-type liquid treating chamber and a first transfer chamber of FIG. 1 viewed from the side.

FIG. 4 illustrates schematically the batch-type liquid treating chamber and the first transfer chamber of FIG. 1 viewed from the side.

Referring to FIG. 4, the batch-type liquid treating chamber 140 may include a first batch-type liquid treating chamber 141, a second batch-type liquid treating chamber 142, and a third batch-type liquid treating chamber 143, as described above. The first batch-type liquid treating chamber 141, the second batch-type liquid treating chamber 142, and the third batch-type liquid treating chamber 143 may be arranged side by side along the first direction X.

The first batch-type liquid treating chamber 141 and the second batch-type liquid treating chamber 142 may have the same or similar structure. For example, the first batch-type liquid treating chamber 141 and the second batch-type liquid treating chamber 142 may have the same or similar structure as each other except for a different type of treating liquid being used. For example, the first batch-type liquid treating chamber 141 may treat the substrate W using a first treating liquid L1. For example, the second batch-type liquid treating chamber 142 may treat the substrate W using a second treating liquid L2. The first treating liquid L1 may be any one of the above-described chemicals. The second treating liquid L2 may be another one of the above-described chemicals.

The first batch-type liquid treating chamber 141 may include a first treating bath 141a, a first liquid supply line 141b, a first liquid discharge line 141c, a first heating member 141d, and a first liquid supply source 141e. The second batch-type liquid treating chamber 142 may include a second treating bath 142a, a second liquid supply line 142b, a second liquid discharge line 142c, a second heating member 142d, and a second liquid supply source 142e. The first liquid supply line 141b, the first liquid discharge line 141c, the first heating member 141d, and the first liquid supply source 141e may perform substantially the same or similar functions as the second treating bath 142a, the second liquid supply line 142b, the second heating member 142d, and the second liquid supply source 142e, respectively. Hereinafter, the first batch-type liquid treating chamber 141 will be mainly described.

The first treating bath 141a may have a containing space in which the first treating liquid L1 is contained. The first treating bath 141a may have a container shape with an pen top. The first treating bath 141a may be provided with a heating member 141d for adjusting the temperature of the first treating liquid L1 contained in the containing space. In addition, the first liquid supply line 141b connected to the first liquid supply source 141e may supply the first treating liquid L1 to the containing space of the first treating bath 141a, and the first liquid discharge line 141c may discharge the first treating liquid L1 supplied to the containing space to the outside. In addition, the storage container F has a container shape with one open side and may have a storage space therein. Also, the storage container F may be immersed in the first treating liquid L1 supplied to the containing space of the first treating bath 141a while a plurality of substrates W are contained therein. Also, at least one penetration hole is formed at the storage container C, and the substrate W stored in the storage container C can be immersed in the first treating liquid L1. The substrates W treated with the first treating liquid L1 may be transferred to the second batch-type liquid treating chamber 142 and the third batch-type liquid treating chamber 143 in this order by the first transfer unit 132, so as to be treated with the second treating liquid L2 and the third treating liquid L3. The third treating liquid L3 may be the rinse liquid described above.

Figure 5:
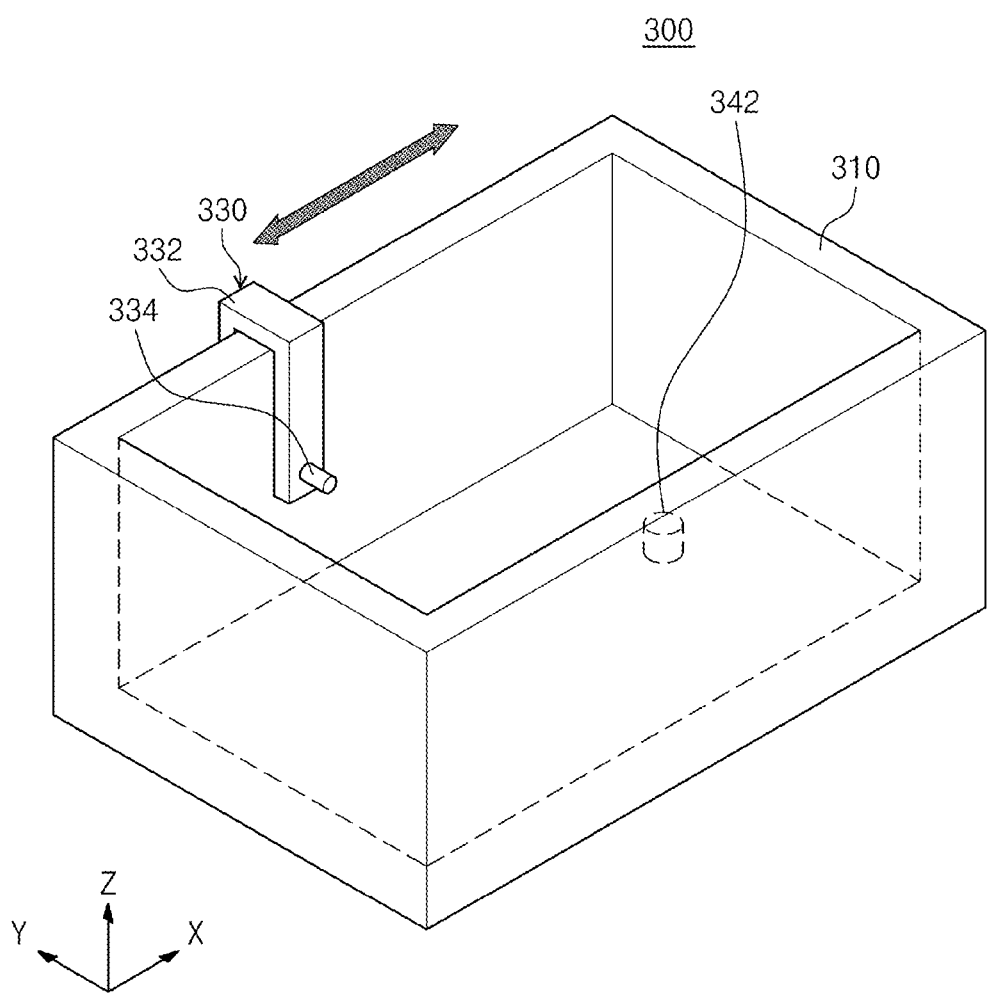
FIG. 5 is a perspective view illustrating a substrate treating apparatus provided in a third batch type liquid treating chamber of FIG. 4.
Figure 6:
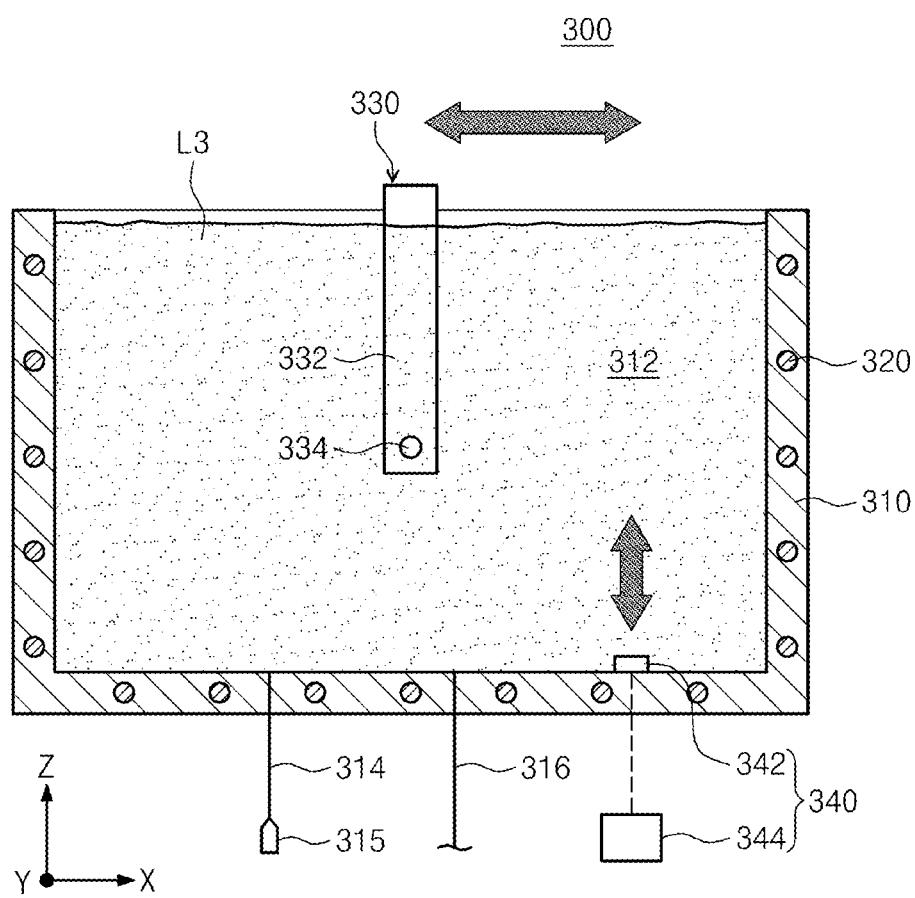
FIG. 6 a cross-sectional view illustrating a substrate treating apparatus provided in the third batch-type liquid treating chamber FIG. 4.

FIG. 5 is a perspective view illustrating a substrate treatment apparatus provided in the third batch-type liquid treating chamber of FIG. 4, and FIG. 6 is a cross-sectional view illustrating a substrate treatment apparatus provided in the third batch-type liquid treating chamber of FIG. 4. Referring to FIG. 5 and FIG. 6, the substrate treatment apparatus 300 provided in the third batch-type liquid treating chamber 143 may include a treating bath 310, a liquid supply line 314, a liquid supply source 315, a liquid discharge line 316, a heating member 320, a posture changing member 330, and a lifting/lowering member 340.

The treating, bath 310 may have a containing space 312 in which the third treating liquid L3 is contained. The treating bath 310 may have a container shape (e.g., rectangular container shape) with an open top. The treating bath 310 may include a bottom portion and a side portion upwardly extending from the edge area of the bottom portion.

In addition, the liquid supply source 315 may supply the treating liquid to the containing space 312. The liquid supply source 315 may supply the third treating liquid L3 to the containing space 312. The liquid supply source 315 may supply the rinse liquid to the containing space 312. The liquid supply source 315 may be connected to the liquid supply line 314. One end of the liquid supply line 314 may be connected to the containing space 312, and the other end of the liquid supply line 314 may be connected to the liquid supply source 315. The liquid supply source 315 may supply the rinse liquid to the liquid supply line 314, and the liquid supply line 314 may supply the rinse liquid to the containing space 312. In addition, the third treating liquid L3 used in the containing space 312 may be discharged to the outside through the liquid discharge line 316.

The heating member 320 may adjust the temperature of the third treating liquid L3 supplied to the containing space 312. For example, the heating member 320 may heat the third treating liquid L3 supplied to the containing space 312 to a set temperature. The heating member 320 may be provided at the bottom portion and side portion of the treating bath 310. For example, the heating member 320 may be buried within the bottom portion and side portion of the treating bath 310. The heating member 320 may control the temperature of the third treating liquid L3 supplied to the containing space 312 by generating a cooling heat or heating heat. The heating member 320 may be a heater. However, the inventive concept is not limited thereto, and the heating member 320 may be variously modified into a known device capable of adjusting a temperature of the third treating liquid L3 supplied to the containing space 312.

The posture changing member 330 may rotate the storage container C immersed in the third treating liquid L3. The posture changing member 330 may rotate the storage container C immersed in the third treating liquid L3 to convert the posture of the substrates NV contained in the storage container C from a vertical posture to a horizontal posture. The posture changing member 330 may include a moving portion 332 and a rotating portion 334.

The moving part 332 may be installed on the treating bath 310. The moving part 332 may be configured to be movable along the first direction X. The moving part 332 may be installed on the side portion of the treating bath 310. For example, the moving part 332 may have a reversed 'U' shape so that it may be installed over the side portion of the treating bath 310. As described above, the moving part 332 is configured to be movable in the first direction X, and the storage container C mounted to the rotating part 334 to be described later may be moved in the first direction X, which is a horizontal direction.

The rotating part 334 may be installed at the moving part 332. The rotating part 334 may be mounted on a mounting groove (not shown) formed at the storage container C. The rotating part 334 may be mounted on the storage container C to rotate the storage container C. For example, the rotating part 334 may have a rod shape, and the rotation axis thereof may be parallel to the second direction Y. In addition, the rotating part 334 may hold the storage container C while the storage container C is immersed in the containing space 312.

The lifting/lowering member 340 may move the storage container C in an up/down direction. The lifting/lowering member 340 may move the storage container C which has been rotated by the posture changing member 330 in the up/down direction. The lifting/lowering member 340 may be provided attachable and detachable to and from the storage container C. The lifting/lowering member 340 may include a shaft 342 and a driver 344. The shaft 342 may be moved in the up/down direction by a driving force generated by the driver 344. The driver 344 may be a pneumatic or hydraulic cylinder, or a motor. However, the inventive concept is not limited thereto, and the driver 344 may be variously modified as a known device capable of moving the shaft 342 in the up/down direction.

In addition, the shall 342 may be provided at the bottom portion of the treating bath 310 and adjacent to the first buffer unit 210. The shaft 342 may have a rod shape. The shaft 342 may serve as a guide shaft for guiding the position of the storage container C which has been rotated by the posture changing member 330. For example, the shaft 342 may be inserted into the alignment groove CG formed on the bottom portion of the storage container C rotated by the posture changing member 330 to guide the position (e.g., level) of the storage container C. In addition, the lifting/lowering member 340 mentioned in the above-described example may also be referred to as a guide member or the like.

Hereinafter, a method of treating a substrate according to an embodiment of the inventive concept will be described with reference to FIG. 7 to FIG. 13. In order to perform the substrate treating method described below, the controller 600 may control the substrate treating apparatus 10.

Figure 7:
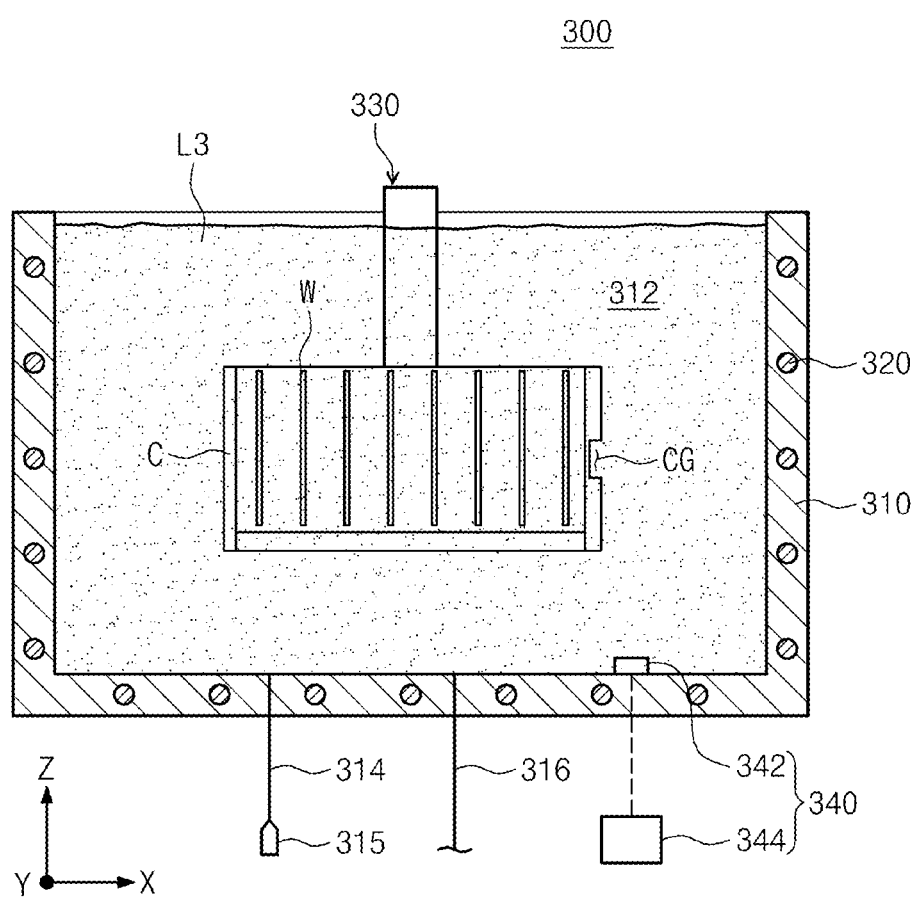
FIG. 7 is a view illustrating a state of treating a substrate in the third batch-type liquid treating chamber of FIG. 6.

Referring to FIG. 7, the storage container C in which a plurality of substrates W, example, about 2 to 50 substrates W, are stored stray be immersed in the third treating liquid L3 supplied to the containing space 312. For example, the storage container C may be immersed in the third treating liquid L3, and the third treating liquid L3 may flow into the storage space of the storage container C to treat the substrates W. In this case, the substrates W stored in the storage container C may maintain a vertical posture. In addition, while the substrates W are treated by the third treating liquid L3, the rotating part of the posture changing member 330 may grip the storage container C.

Figure 8:
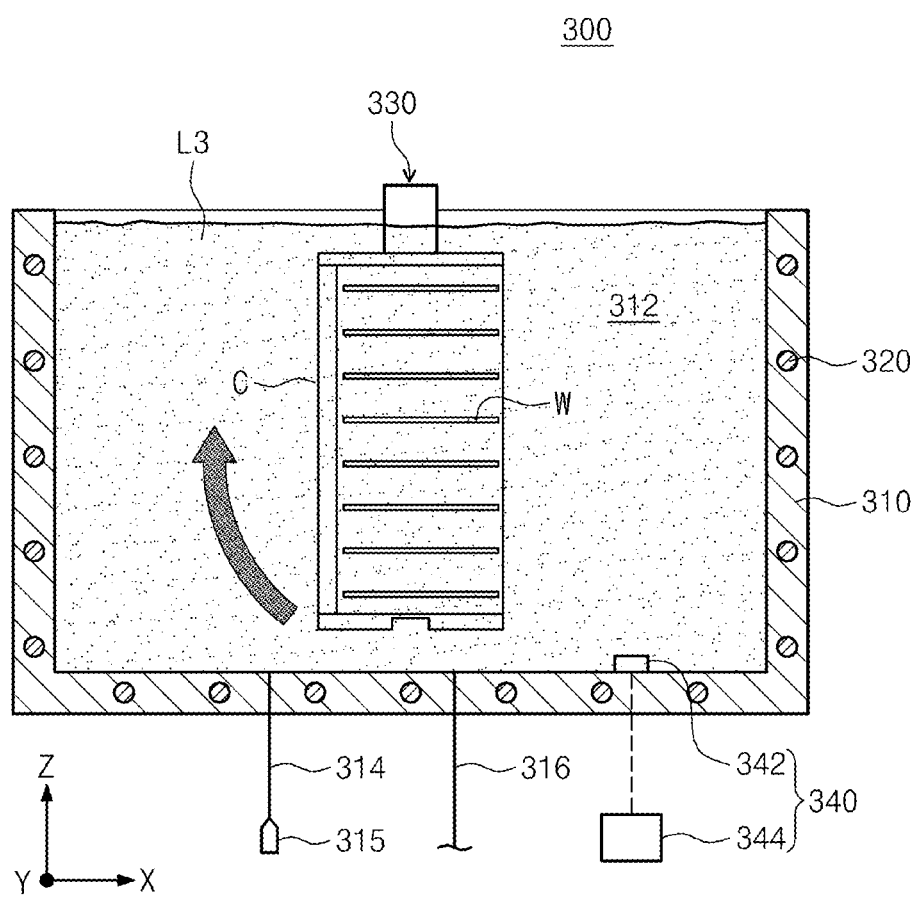
FIG. 8 is a view illustrating a state in which a posture of a substrate is changed in the third batch-type liquid treating chamber of FIG. 6.

Referring to FIG. 8, when the treating of the substrates W is completed by the third treating liquid L3, the rotating part 334 of the posture changing member 330 may rotate the storage container C. The rotating part 334 of the posture changing member 330 may rotate the storage container C about a rotation axis thereof parallel to the second direction Y, e.g., rotate the storage container C about 90 degrees. When the storage container C is rotated, the posture of the plurality of substrates W stored in the storage container C may be changed from a vertical posture to a horizontal posture. In this case, the rotating part 334 may rotate the storage container C while the storage container C is immersed the third treating liquid L3 supplied to the contain a 312. This is because when the storage container C is rotated while being exposed to the outside (e.g., exposed to the air), the substrates W stored in the storage container C can be dried.

Figure 9:
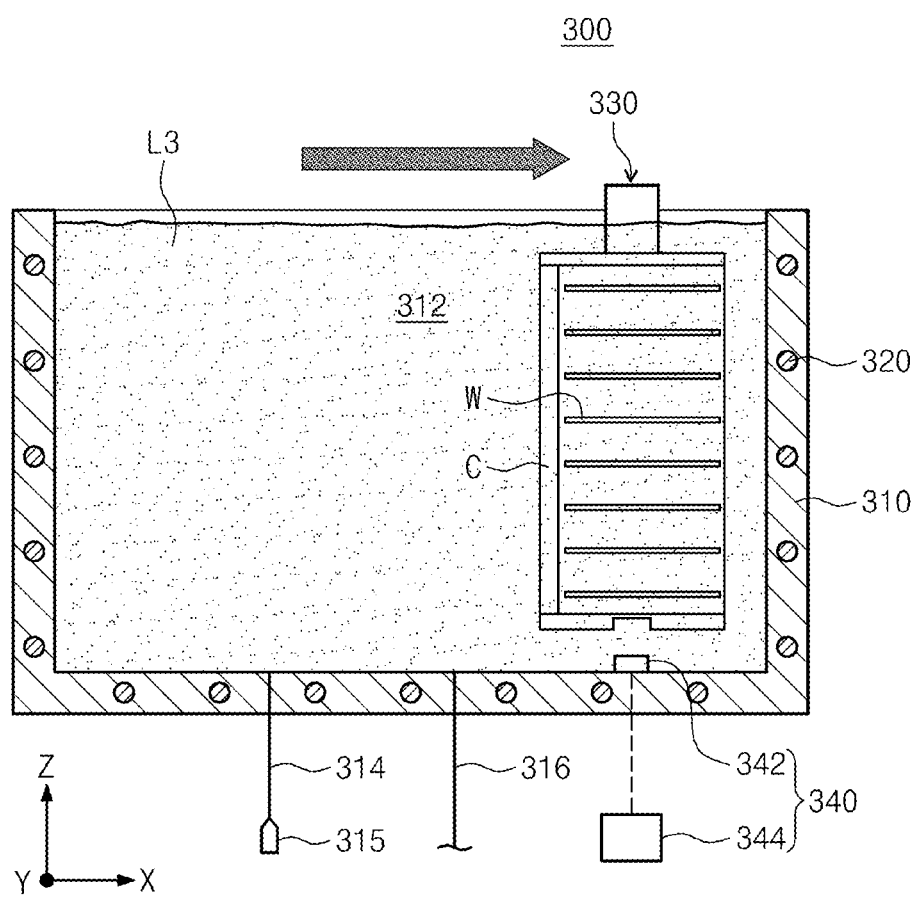
FIG. 9 is a view illustrating a state in which a storage container is moved to a top part of a lifting/lowering member in the third batch-type liquid treating chamber of FIG. 6.

Referring to FIG. 9, the storage container C rotated by the rotating part 334 may be moved along the first direction X while being mounted on the rotating part 334. For example, the age container C may be moved to above the lifting/lowering member 340. In addition, the movement of the storage container C the horizontal direct may be performed in a state of being immersed in the third treating liquid L3 supplied to the containing space 312. This is because when the storage container C is moved while being exposed to the outside (e.g., exposed to the air), the substrates W stored in the storage container C can be dried.

Figure 10:
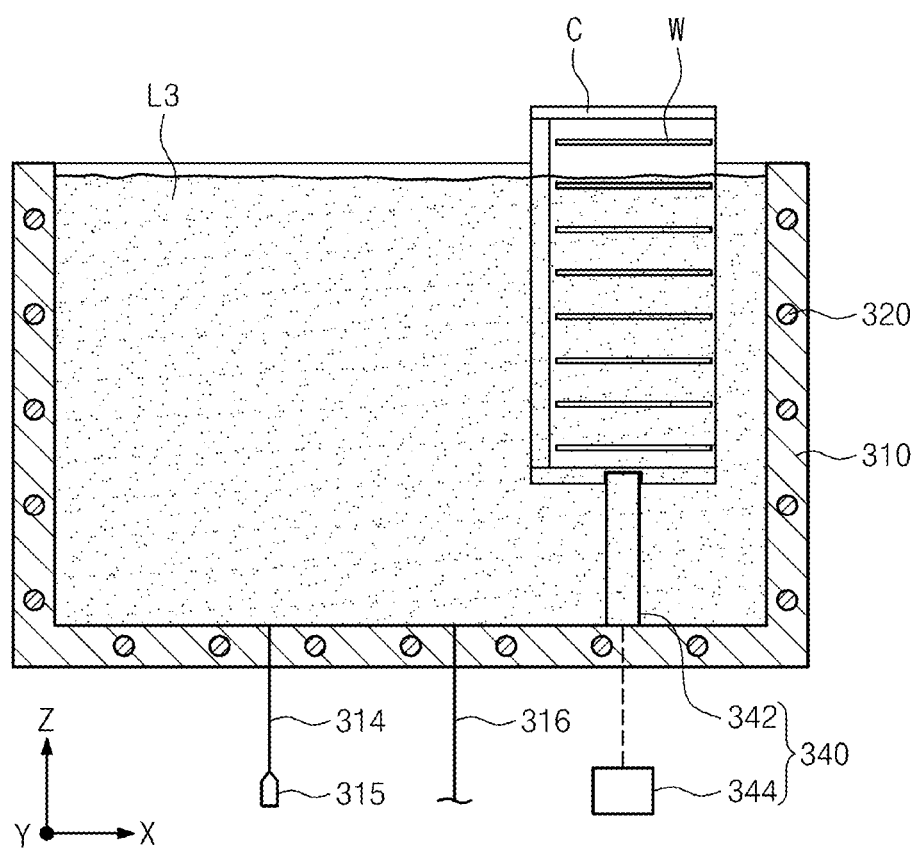
FIG. 10 is a view showing a state in which a substrate disposed at a topmost end of the substrates stored it the storage container is exposed to air in a third batch-type liquid treating chamber of FIG. 6.

Referring to FIG. 10, the shaft 342 of the lifting/lowering member 340 may be moved upward and inserted into an alignment groove CG formed in the storage container C. When inserted into the alignment groove CG, the rotating part 334 may be moved along the second direction Y to be separated from the storage container C. Thereafter, the shaft 342 may move the storage container C upward to expose some of the substrates W contained in the storage container C to the outside (e.g., expose to the air). For example, the shaft 342 may move the storage container C upward to expose only a topmost substrate among the substrates W stored in the storage container C to the outside (e.g., expose the substrate W to the air). This is to prevent the remaining substrates W from being dried, that is, to maintain wettability, except for the topmost substrate among the substrates W taken out from the storage container C by the third transfer unit 152.

Figure 11:
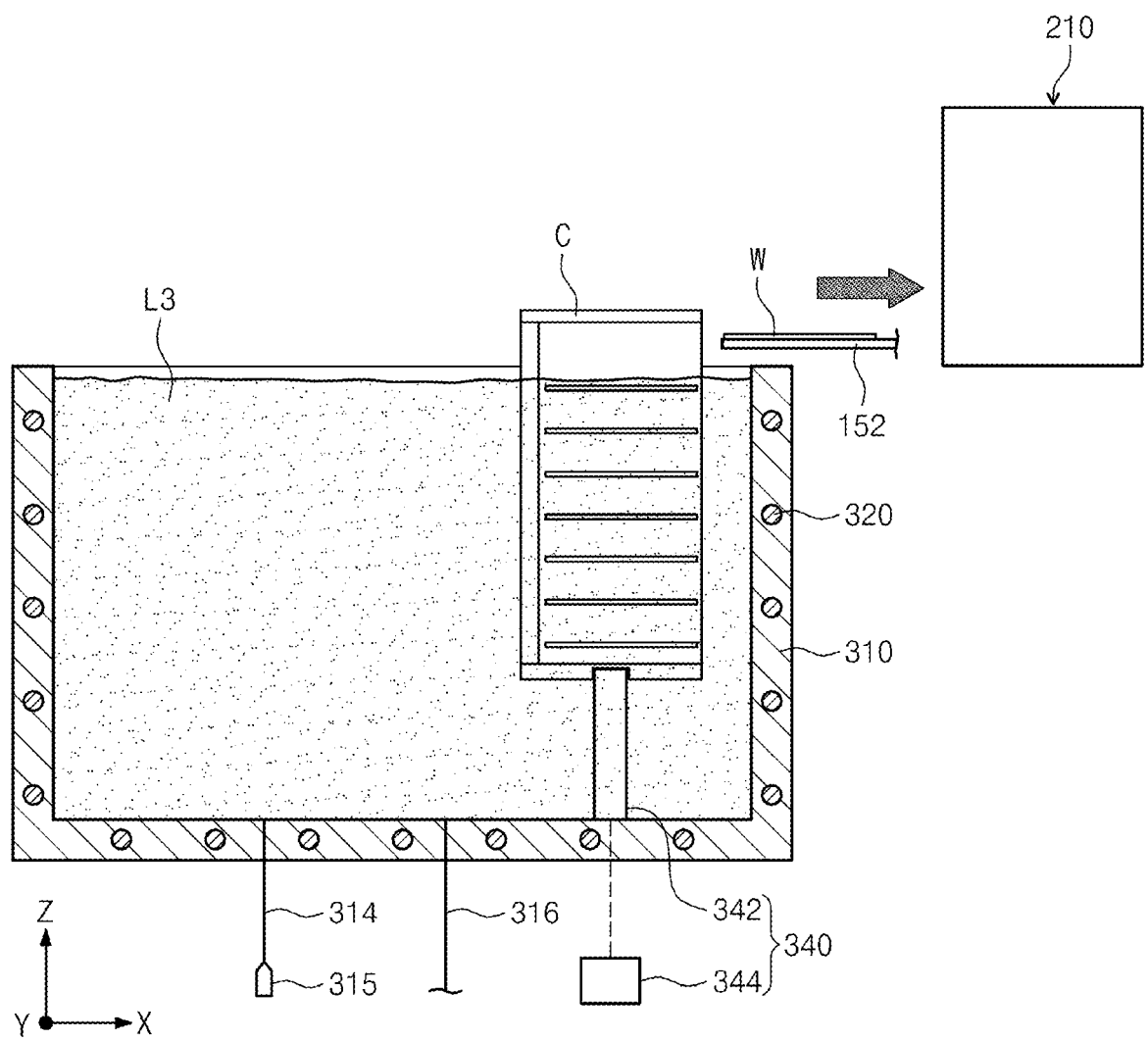
FIG. 11 is a view illustrating a state in which a substrate is taken out of the third batch-type liquid treating chamber of FIG. 6 and brought into a first buffer unit.

Referring to FIG. 11, the topmost substrate W among the substrates contained in the storage container C may be carried out from the storage container C by the third transfer unit 153 and returned to the first buffer unit 210. In this case, as described above, the first buffer unit 210 may include a nozzle for supplying a chemical liquid or mist to maintain the wettability of the substrate W transferred to the storage space of the first buffer unit 210. The chemical liquid or mist may include isopropyl alcohol (IPA), the chemical described above, and the treating liquid selected from the rinse liquid described above.

Figure 12:
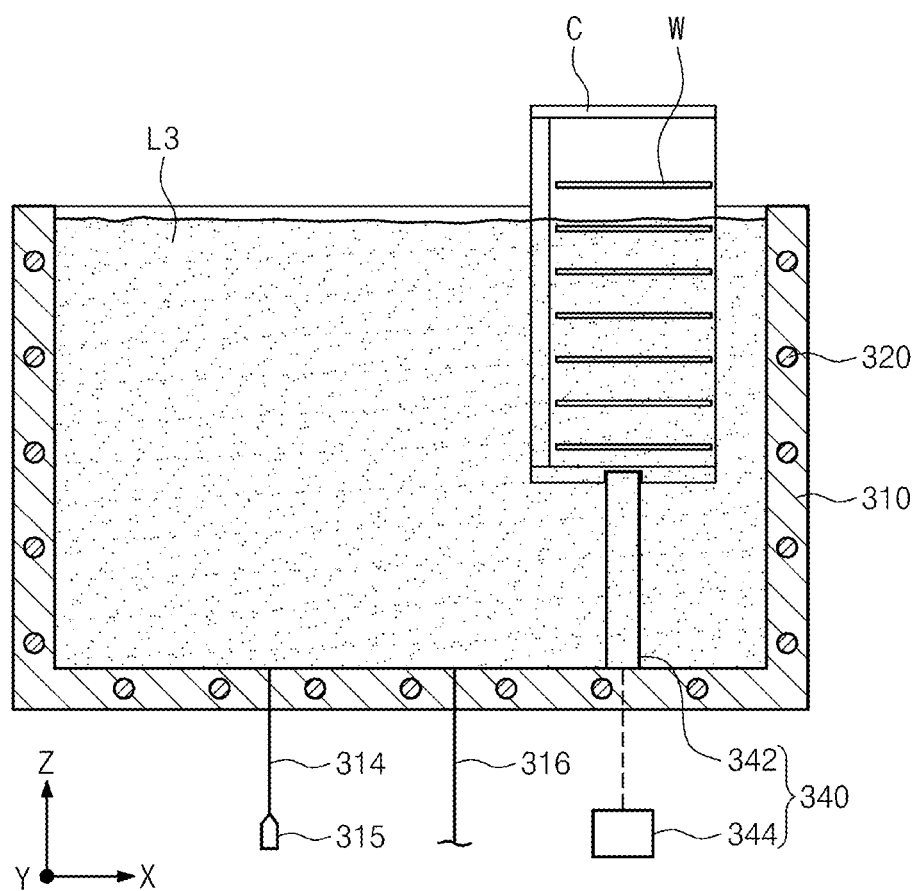
FIG. 12 is a view illustrating a state in which a substrate disposed at the topmost end of the substrates stored in the storage container is exposed to air after the substrate is taken out from the third batch-type liquid treating chamber of FIG. 4.

Referring to FIG. 12, after the topmost substrate W disposed has been taken out to the storage container C as described above, the shaft 342 of the lifting/lowering member 340 may move the storage container C in an upward direction once again. Accordingly, another topmost substrate W among the substrates W contained in the storage container C may be exposed to the outside (e.g., exposed to the air). This is to prevent the remaining substrates W from being dried, that is, to maintain wettability, except for the another topmost substrate W taken out from the storage container C by the third transfer unit 152.

Figure 13:
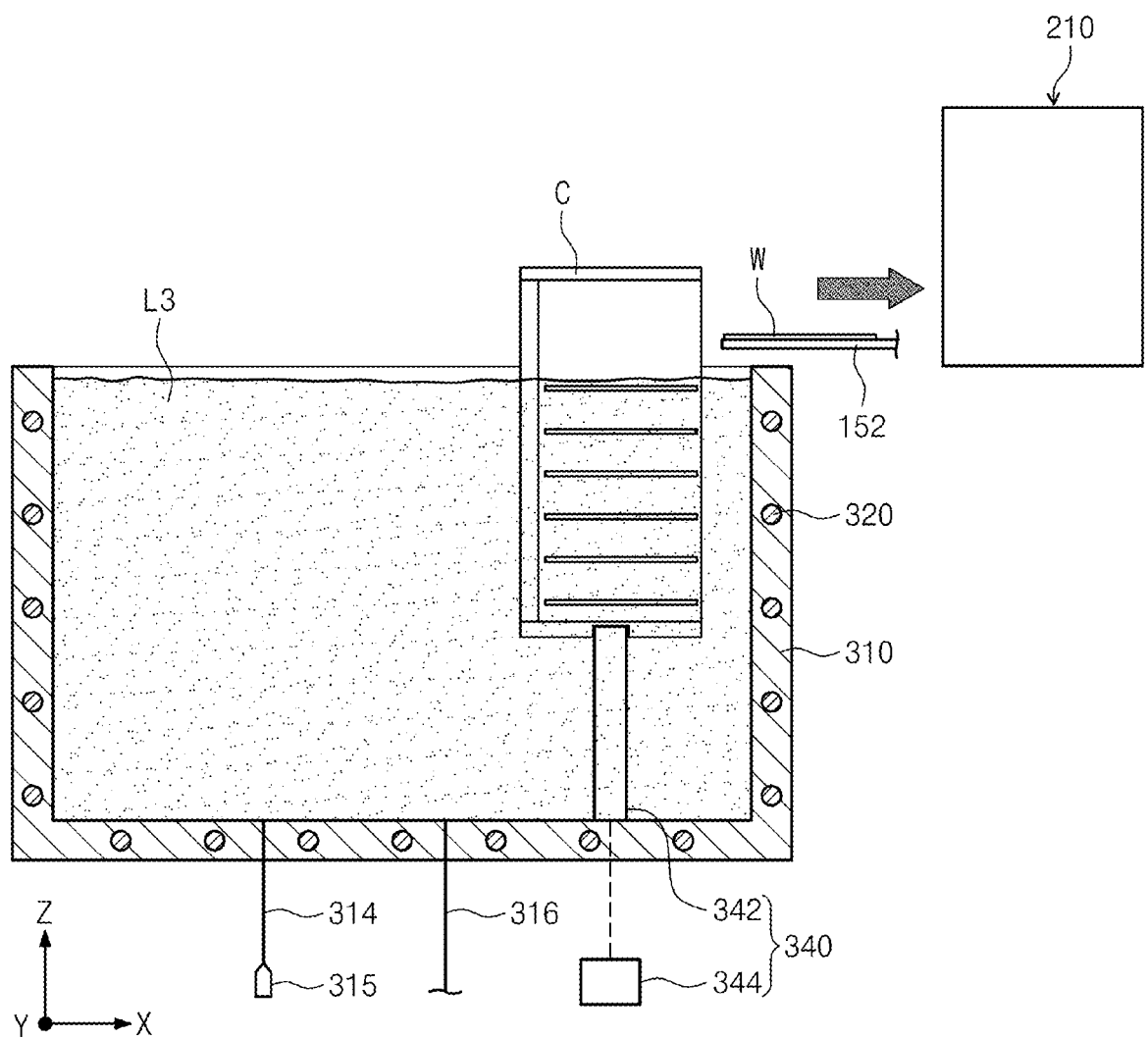
FIG. 13 is a view illustrating a state in which a substrate is taken out of the third batch-type liquid treating chamber of FIG. 6 and brought into the first buffer unit.

Referring to FIG. 13, the another topmost substrate W among the substrates W contained in the storage container C may be carried out from the storage container C by the third transfer unit 153 and returned to the first buffer unit 210.

Figure 14:
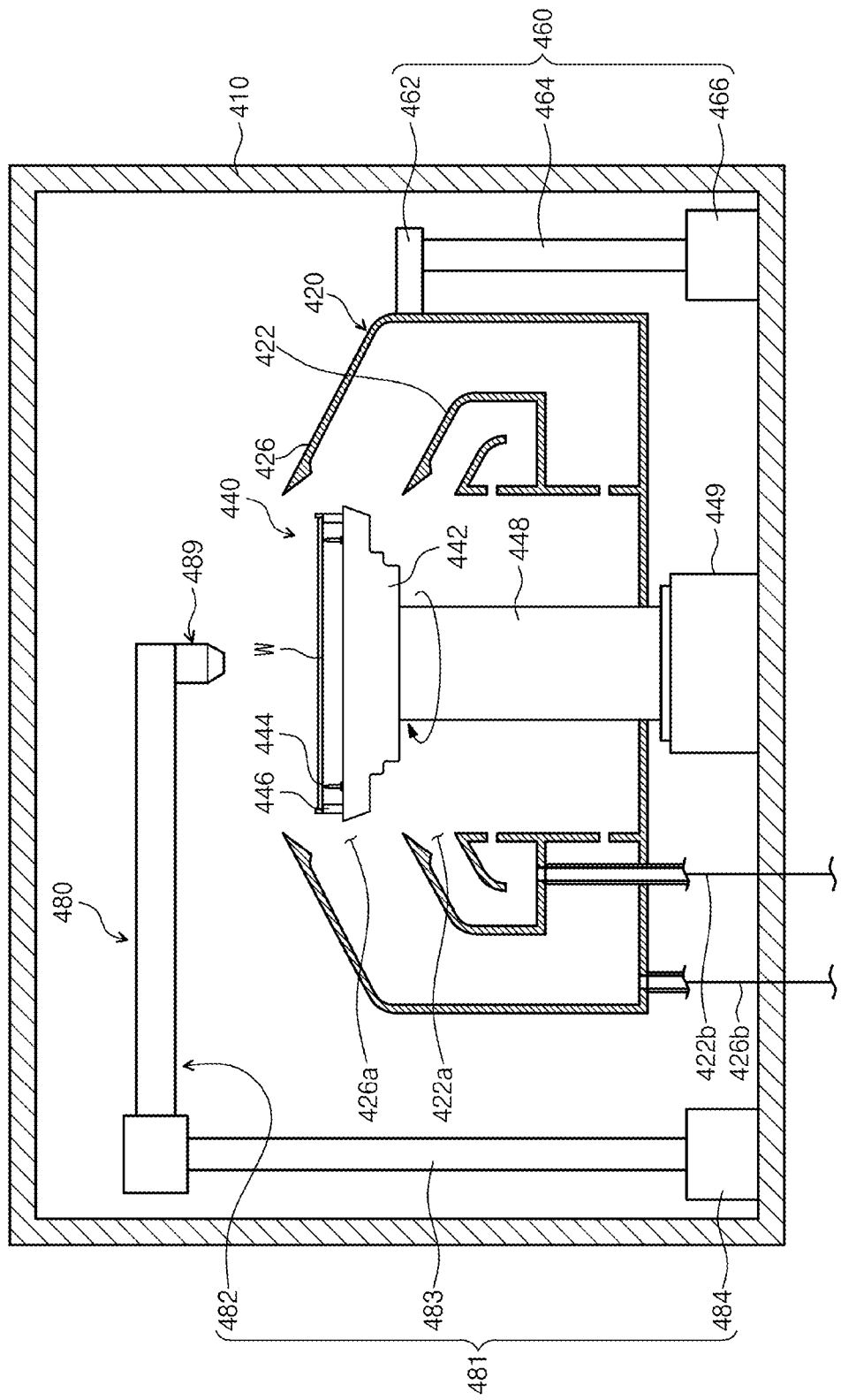
FIG. 14 is a view illustrating a substrate treat ng apparatus provided in the single-type liquid treating chamber of FIG. 1.

FIG. 14 is a view illustrating a substrate treating apparatus provided in the single-type liquid treating chamber FIG. 1. The substrate treating apparatus 400 provided in the single-type liquid treating chamber 230 may include a housing 410, a processing container 420, a support unit 440, a lifting/lowering unit 460, and a liquid supply unit 480.

The housing 410 has a processing space 412 therein. The housing 410 may have a cylindrical shape having a space therein. A processing container 420, a support unit 440, a lifting/lowering unit 460, and a liquid supply unit 480 may be provided in the inner space 412 of the housing 410. The housing 410 may have a rectangular shape when viewed from as front cross section. However, the inventive concept is not limited thereto, and the housing 410 may be transformed into various shapes capable of having a processing space 412.

The processing container 420 has a cylindrical shape with an open top. The processing container 420 has an inner recollecting container 422 and an outer recollecting container 426. Each of the recollecting containers 422 and 426 recovers different treating liquids among the treating liquids used in the process. The inner recollecting contain 422 is provided in an annular ring shape surrounding the substrate support unit 440, and the outer recollecting container 426 is provided in an annular ring shape surrounding the inner recollecting container 426. The inner space 422a of the inner recollecting container 422 and the inner recollecting container 422 function as a first inlet 422a through which a treating liquid flows into the internal recollecting container 422. The space 426a between the inner recollecting container 422 and the external recollecting container 426 functions as a second inlet 426a through which a treating liquid flows into the outer recollecting container 426. According to an embodiment, each of the inlets 422a and 426a may be positioned at different heights. Recollecting lines 422b and 426b are connected under the bottom surfaces of each of the recollecting containers 422 and 426. The treating liquids introduced into each of the recollecting containers 422 and 426 can be provided and reused to an external treating liquid regeneration system (not illustrated) through the recollecting tines 422b and 426b.

The support unit 110 supports the substrate W in the processing space 412. The support unit 440 supports and rotates the substrate W during the process. The support unit 440 has a support plate 442, a support pin 444, a chuck pin 446, and rotation driving members 448 and 449.

The support plate 442 is provided in a substantially circular plate shape and has an upper surface and a bottom surface. The bottom surface has a smaller diameter than the top surface. That is, the support plate 442 may have a wide top surface and a narrow lower surface shape. The top surface and the bottom surface are positioned such that their central axes coincide with each other. In addition, a heating means (not shown) may be provided on the support plate 442. The heating means provided to the support plate 442 may heat the substrate W placed on the support plate 442. The heating means can generate heat. The heat generated by the heating means may be a heating temperature or a cooling temperature. The heat generated by the heating means may be transferred to the substrate W placed on the support plate 442. In addition, the heat transferred to the substrate W may heat the treating liquid supplied to the substrate W. The heating means may be a heater and/or a cooling coil. However, the inventive concept is not limited thereto, and the heating means may be variously modified into known devices.

A plurality of support pins 444 are provided. The support pins 411 are disposed at an edge of the upper surface of the support plate 442, spaced apart from each other by a predetermined interval, and upwardly protrude from the support plate 442. The support pins 444 are disposed to have an annular ring shape as a whole by combination with each other. The support pins 444 support an edge of the bottom surface of the substrate W so that the substrate W is spaced apart from the upper surface of the support plate 442 by a predetermined distance.

A plurality of chuck pins 446 are provided. The chuck pins 446 are disposed farther from the center of the support plate 442 than the support pins 444. The chuck pins 446 are provided to upwardly protrude from the upper surface of the support plate 442. The chuck pins 416 support the side portion of the substrate W so that the substrate W is not laterally separated from a predetermined position when the support plate 442 is rotated. The chuck pins 446 are provided to be able to move linearly between the outer position and the inner position along the radial direction of the support plate 442. The outer position is a position away from the center of the support plate 442 compared to the inner position. When the substrate W loads or unloads on the support plate 442, the chuck pins 446 are located at an outer position, and when a process is performed on the substrate W, the chuck pins 446 are located at an inner position. The inner position is a position where the chuck pins 446 and the side portion of the substrate W are in contact with each other, and the outer position is a position where the chuck pins 446 and the substrate W are spaced apart from each other.

The rotation driving members 448 and 449 rotate the support plate 442. The support plate 442 may be rotated around a magnetic central axis by the rotation driving members 448 and 449. The rotation driving members 448 and 449 include a support shaft 448 and a driving part 449. The support shaft 448 has a cylindrical shape facing a fourth direction 16. The upper end of the support shaft 448 is fixedly coupled to the bottom surface of the support plate 442. According to an embodiment, the support shaft 448 may be fixedly coupled to the center of the bottom surface of the support plate 442. The driving unit 449 provides a driving force to rotate the support shaft 448. The support shaft 448 is rotated by the driving part 449, and the support plate 442 is rotatable together with the support shaft 448.

The lifting/lowering unit 460 linearly moves the processing container 420 in the up/down direction. As the processing container 420 is moved up and down, the relative height of the processing container 420 with respect to the support plate 442 is changed. When the substrate W is loaded or unloaded on the support plate 442, the processing container 420 is lowered by the lifting/lowering unit such that the support plate 442 protrudes upward from the processing container 420. In addition, when the processing proceeds, the height of the processing container 420 is adjusted so that the treating liquid may flow into preset recollecting containers 422 and 476 according to the type of treating liquid supplied to the substrate W. The lifting/lowering unit 460 has a bracket 462, a moving shaft 464, and a driver 466. The bracket 462 is fixedly installed on the outer wall of the processing container 420, and a moving shaft 464 moving in the up/down direction by the driver 466 is fixedly coupled to the bracket 462. Selectively, the lifting/lowering 460 may move the support plate 442 in an up/down direction.

The liquid supply unit 480 may supply a treating liquid to the substrate W. The treating liquid may be an organic solvent, or the rinse liquid or the chemical described above. The organic solvent may be isopropyl alcohol (IPA) liquid.

The liquid supply unit 480 may include a moving member 481 and a nozzle 489. The moving member 481 moves the nozzle 489 to a process position and a standby position. The process position is a position at which the nozzle 489 faces the substrate W supported by the support unit 440. According to an embodiment, the process position is a position at which the treating liquid is discharged from the upper surface of the substrate W. In addition, the process position includes a first supply position and a second supply position. The first supply position may be a position closer to the center of the substrate W than the second supply position, and the second supply position may be a position including an end of the substrate. Optionally, the second supply position may be an area adjacent to the end of the substrate. The standby position is defined as a position where the nozzle 489 deviates from the process position. According to an embodiment, the standby position may be a position at which the nozzle 489 stands by before or after the processing is completed on the substrate W.

The moving member 481 includes an arm 482, a support shaft 484, and a driver 484. The support shaft 484 is located on one side of the processing container 420. The support shaft 484 has a rod shape with its longitudinal direction facing the fourth direction. The support shaft 484 is provided to be rotatable by the driver 484. The support shaft 484 is provided to be upwardly and downwardly movable. The arm 482 is coupled to the upper end of the support shaft 484. The arm 482 extends vertically from the support shaft 484. A nozzle 489 is coupled to the end of the arm 482. As the support shaft 434 is rotated, the nozzle 489 may swing together with the arm 482. The nozzle 489 may swing and be moved to a process position and a standby position. Optionally, the arm 482 may be provided to be able to move forwardly and backwardly in its longitudinal direction. When viewed from above, a path through which the nozzle 489 moves may coincide with a central axis of the substrate W at a process position.

Figure 15:
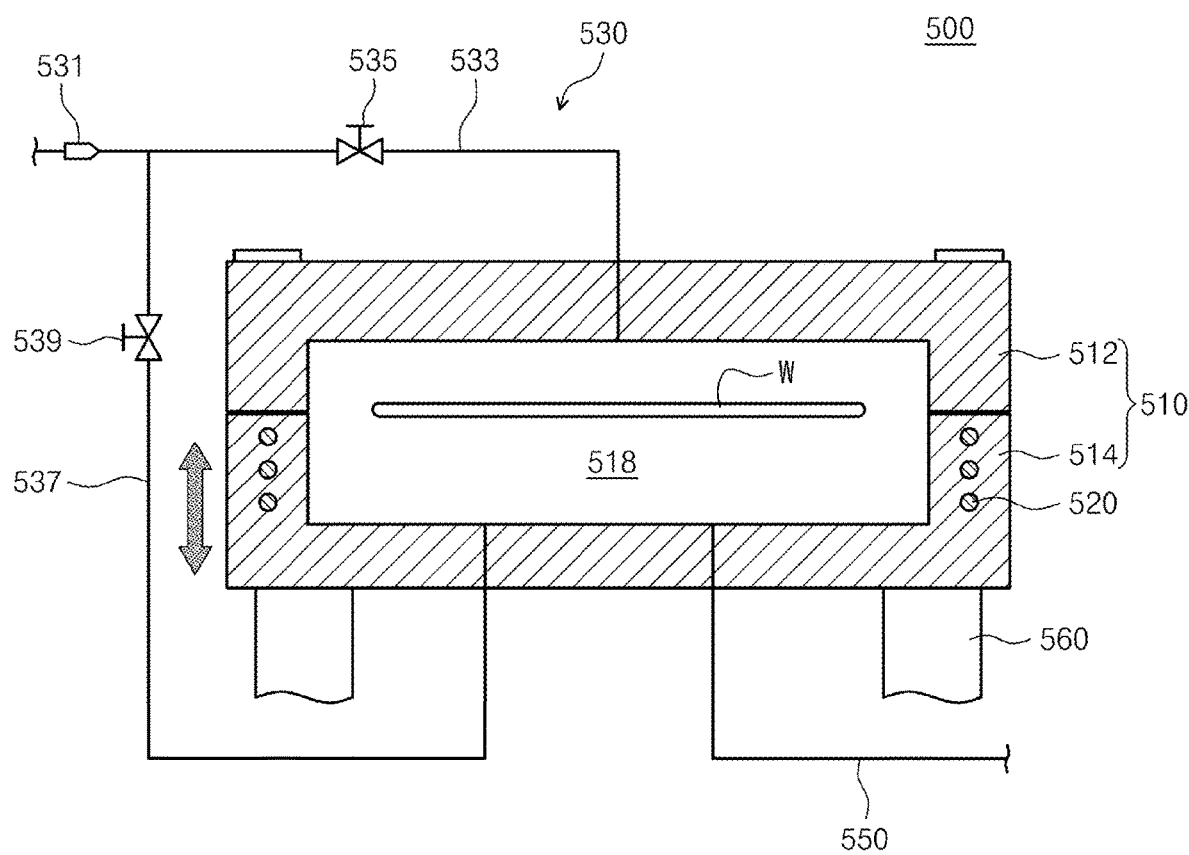
FIG. 15 is a view illustrating a substrate treating apparatus provided in a drying chamber of FIG. 1.

FIG. 15 is a view illustrating a substrate treating apparatus provided in the drying chamber of FIG. 1. Referring to FIG. 15, the drying chamber 500 may remove the treating liquid remaining on the substrate W by using the drying fluid G in a supercritical state. The drying chamber 500 may be a supercritical chamber for removing the treating liquid (e.g., a rinse liquid or an organic solvent) remaining on the substrate W using a supercritical fluid. For example, the drying chamber 500 may perform a drying treatment process of removing the organic solvent remaining on the substrate W using carbon dioxide ($CO_2$) in a supercritical state.

The drying chamber 500 may include a body 510, a heating member 520, a fluid supply unit 530, a fluid exhaust unit 550, and a lifting/lowering member 560. The body 510 may have an inner space 518 in which the substrate W is treated. The body 510 may provide an inner space 518 in which the substrate W is treated. The body 510 may provide an inner space 518 in which the substrate W is dried by the drying fluid G in a supercritical state.

The body 510 may include an upper body 512 and a lower body 514. The upper body 512 and the lower body 514 may be combined with each other to form the inner space 518. The substrate W may be supported in the inner space 518. For example, the substrate W may be supported by a support member (not shown) the inner space 518. The support member may be configured to support the lower surface of the edge region of the substrate W. Any one of the upper body 512 and the lower body 514 may be coupled to the lifting/lowering member 560 to be moved in the up/down direction. For example, the lower body 514 may be coupled to the lifting/lowering member 560 to be moved in the up/town direction by the lifting/lowering member 560. Accordingly, the inner space 518 of the body 510 may be selectively sealed. In the above-described example, the lower body 514 is coupled to the lifting/lowering member 560 to move in the up/down direction, but the inventive concept is not limited to it. For example, the upper body 512 may be coupled to the lifting/lowering member 560 to move in the up/down direction.

The heating member 520 may heat the drying fluid G supplied to the inner space 518. The heating member 520 may phase-change the drying fluid G supplied to the inner space 518 into a supercritical state by raising the temperature of the inner space 518 of the body 510. In addition, the heating member 520 may raise the temperature of the liter space 518 of the body 510 to maintain the supercritical state of the drying fluid G supplied to the inner space 518.

In addition, the heating member 520 may be buried in the body 510. For example, the heating member 520 may be buried in any one of the upper body 512 and the lower body 514. For example, the heating member 520 may be provided in the lower body 514. However, the inventive concept is not limited thereto, and the heating member 520 may be provided at various positions capable of raising the temperature of the inner space 518. In addition, the heating member 520 may be a heater. However, the inventive concept is not limited thereto, and the heating member 520 may be variously modified into a known device capable of raising the temperature of the inner space 518.

The fluid supply unit 530 may supply the drying fluid G to the inner space 518 of the body 510. The drying fluid G supplied by the fluid supply unit 530 may include a carbon dioxide ($CO_2$). The fluid supply unit 530 may include a fluid supply source 531, a first supply line 533, a first supply valve 535, a second supply line 537, and a second supply valve 539.

The fluid supply source 531 may store and/or supply the drying fluid G supplied to the inner space 518 of the body 510. The fluid supply source 531 may supply the drying fluid G to the first supply line 533 and/or the second supply line 537. For example, a first supply valve 535 may be installed on the first supply line 533. In addition, a second supply valve 539 may be installed on the second supply line 537. The first supply valve 535 and the second supply valve 539 may be on/off valves. According to an on/off state of the first supply valve 535 and the second supply valve 539, the drying fluid G may selectively flow through the first supply line 533 or the second supply line 537.

In the above-described example, the first supply line 533 and the second supply line 537 are connected to one fluid supply source 531, but the inventive concept is not limited thereto. For example, a plurality of fluid supply sources 531 may be provided, the first supply line 533 may be connected to any one from a plurality of fluid supply sources 531, and the second supply line 537 may be connected to another one of the fluid supply sources 531.

In addition, the first supply line 533 may be an upper supply line that supplies drying gas from an upper portion of the inner space 518 of the body 510. For example, the first supply line 533 may supply a drying gas to the inner space 518 of the body 510 in a direction from top to bottom. For example, the first supply line 533 may be connected to the upper body 512. In addition, the second supply line 537 may be a lower supply line that supplies drying gas from a lower portion of the inner space 518 of the body 510. For example, the second supply line 537 may supply drying gas to the inner space 518 of the body 510 in a downward-to-upward direction. For example, the second supply line 537 may be connected to the lower body 514.

The fluid exhaust unit 550 may exhaust the drying fluid G from the inner space 518 of the body 510.

As described above, the substrate treatment apparatus 10 according to an embodiment of the inventive concept may include both the batch-type liquid treating chamber 140 and the single-type liquid treating chamber 230. Accordingly, it is possible to have all the advantages of the batch-type liquid treatment method and the single-type liquid treating chamber.

For example, in the batch-type liquid treating chamber 140, a plurality of substrates W may be treated at once, and thus throughput of the treating of the substrate W is excellent, and processing uniformity between the substrates W is very high. In addition, when the pattern formed on the substrate W has a high aspect ratio, it is possible to supplement the batch-type liquid treating chamber 140 (e.g., the portion that has not yet been etched) by supplying a chemical, a rinse liquid, and the like from the single-type treating chamber 230. In addition, the substrate W wetted by organic solvent supplied by the single-type liquid treating chamber 230 or the first buffer unit 210 may be transferred to the drying chamber 240 for drying the substrate W by supplying a supercritical fluid. The supercritical fluid has an excellent penetration property into a space between the patterns formed on the substrate W, and may dry the substrate W without rotating the substrate W, thereby minimizing the occurrence of the pattern leaning phenomenon described above. In addition, the substrate treatment apparatus 10 of the inventive concept may perform all of the single-type liquid treatment method, the batch-type liquid treatment method, and the method of drying the substrate W using a supercritical fluid, thereby improving defects due to particles, and shedding and flowability. In addition, since the number of substrates W treatable in the batch-type liquid treating chamber 140 is relatively large, a large number of liquid treating chambers are not required, so there is an advantage of reducing the footprint of the substrate treatment apparatus 10. In addition, by further including the single-type liquid treating chamber 230 as described above, it is possible to solve the problem of abnormal growth of $SiO_2$ in a pattern on the substrate W that may occur when the substrate W is treated using only the batch-type liquid treating chamber 140.

In addition, as in the substrate treating apparatus 10 according to an embodiment of the inventive concept, it is essential to change the posture of the substrate W from a vertical posture to a horizontal posture when both the batch-type liquid treating chamber 140 and the single-type liquid treating chamber 230 are provided. Accordingly, the substrate treating apparatus 10 according to an embodiment of the inventive concept includes a posture changing member 330 to convert the posture of the substrate W from a vertical posture to a horizontal posture. In this case, the wettability of the substrate W may be maintained as much as possible (if not, the substrate W may be dried to generate a water mark), and the posture of the substrate W is changed while the substrate W is immersed in the treating liquid L. In addition, when the substrate W is taken out of the batch-type liquid treating chamber 140 and transferred to the first buffer unit 210, the remaining substrates W except for the substrate W be transferred remain immersed in the treating liquid L, thereby minimizing drying of the substrate W and generating a water mark.

In the above-described example, when the substrate W is transferred between the batch-type, liquid treating chambers 140, the storage container C is transferred by the first transfer unit 132, but the inventive concept is not limited thereto. For example, the first transfer unit 132 may grip a plurality of substrates W in a vertical posture at Once rather than the storage container C to transport a plurality of substrates W between the batch-type liquid processing chambers 140.

In the above-described example, one substrate W is taken out of the third batch-type liquid treating chamber 143 at a time and transferred to the first buffer unit 210, but the inventive concept is not limited thereto. For example, the second transfer unit 152 may grip a plurality of substrates W at once and take the plurality of substrates W out of the storage container C at once. In addition, the second transfer unit 152 may transfer a plurality of substrates W to the first buffer unit 210 at once. In this ease, the first buffer unit 210 may supply a chemical liquid or mist to the storage space of the first buffer unit 210 as described above in order to maintain wettability of the introduced substrates W.

In the above-described example, it is described that the substrate treating apparatus 10 according to an embodiment of the Inventive concept includes all of the single-type liquid treating chamber 230 and the drying chamber 240, but the inventive concept is not limited thereto. For example, the substrate treating apparatus 10 may include only one of a single-type liquid treating chamber 230 and a drying chamber 240.

In the above-described example, the substrate W taken out from the batch-type liquid treating chamber 140 is transferred to the single-type liquid treating chamber 230, and after the substrate W treatment is completed in the single-type liquid treating chamber 230 the substrate W transferred to the drying chamber 240, but the inventive concept is not limited thereto. For example, if the particle level is good, the substrate W may be immediately transferred to the drying chamber 240 from the batch-type liquid treating chamber 140.

Figure 16:
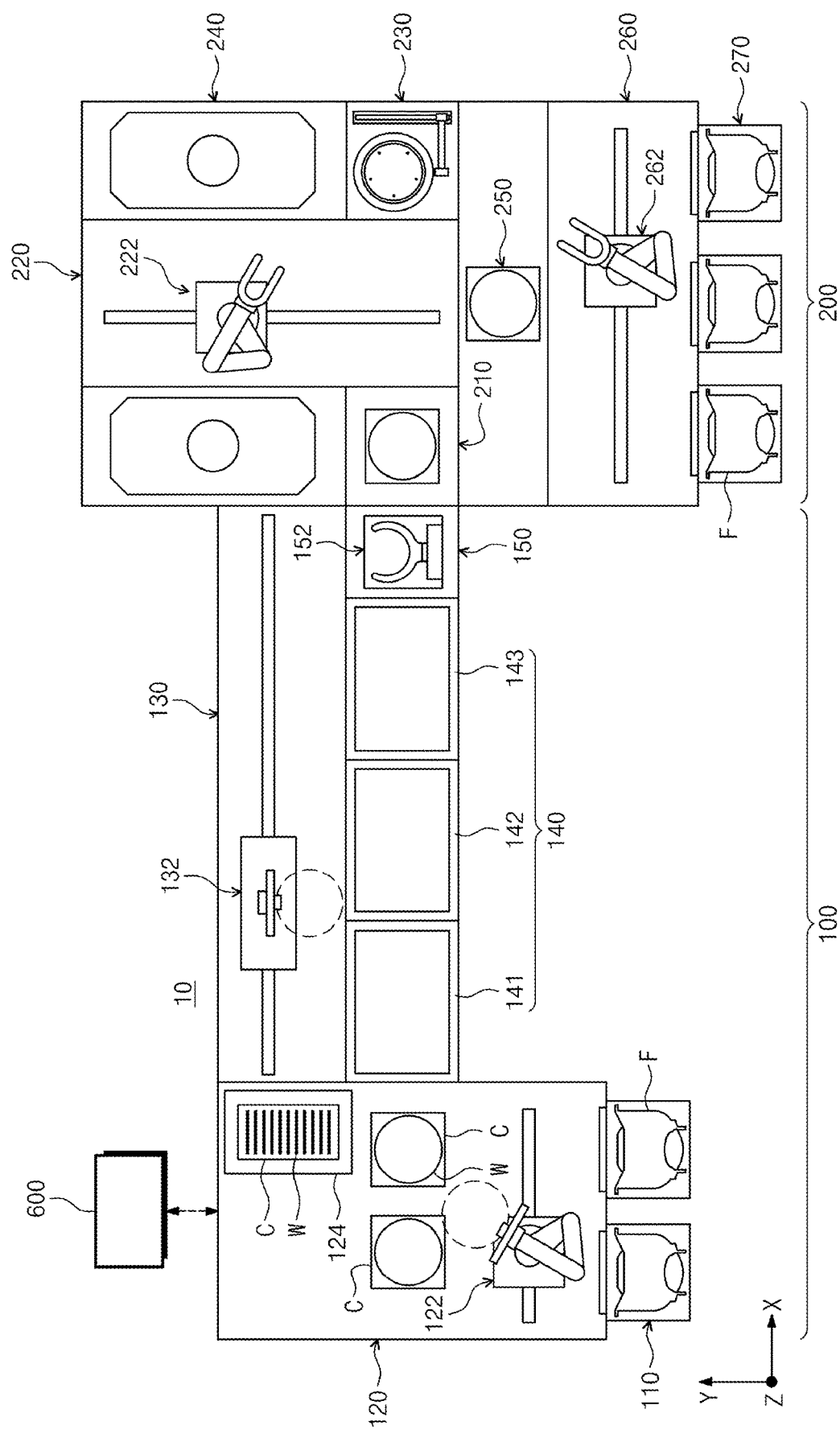
FIG. 16 is a schematic view of a substrate treating apparatus according to another embodiment of the inventive concept viewed from above.

In the above-described example, when the substrate W is transferred between the batch-type liquid treating chambers 140 of the first treating part 100, the storage container C is transferred by the first transfer unit 132, but the inventive concept is not limited thereto. For example, as illustrated in FIG. 16, the first transfer unit 132 may have a batch-hand for transferring a plurality of substrates W (e.g., 25 wafers) at once, and the first transfer unit 132 may transfer only a plurality of substrates W instead of the storage container C between the batch-type liquid treating chambers 140. In addition, when the first transfer unit 132 has a batch-hand, a storage container C may be disposed in each of the batch-type liquid treating chambers 140, or a support member supporting a plurality of substrates W may be provided.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
   a first treating part performing a liquid treatment on a plurality of substrates in a batch-type treating method; and
   a second treating part treating the substrates which have been treated at the first treating part, and performing a liquid treatment or a drying treatment on a single substrate in a single-type treating method,
   wherein the first treating part comprises:
      a treating bath having a containing space to contain the treating liquid;
      a storage container submerged in the treating liquid contained in the containing space and having a storage space for storing the substrates; and
      a posture changing member rotating the storage container submerged in the treating liquid, and
   wherein the posture changing member comprises:
      a rotation unit installable on the storage container and rotating the storage container; and
      a moving unit installed on the treating bath and moving the storage container installed on the rotation unit in a horizontal direction.

2. The substrate treating apparatus of claim 1, wherein the first treating part comprises a first load port unit on which a container storing an untreated substrate is placed; and the second treating part comprises a second load port unit on which a container storing a treated substrate is placed.

3. The substrate treating apparatus of claim 2, wherein the first treating part further comprises a batch-hand transferring a plurality of substrates taken from the container placed on the first load port unit and the second treating part comprises a single-hand transferring a single substrate which has been liquid treated at the first treating part.

4. The substrate treating apparatus of claim 2, wherein the second treating part comprises:
   a single-type treating chamber performing the liquid treatment and/or the drying treatment on the substrate in the single-type treating method; and
   a second buffer unit disposed between the single-type treating chamber and the second load port unit and temporarily storing a substrate which has been treated at the single-type treating chamber.

5. The substrate treating apparatus of claim 2, wherein the second treating part comprises:
   a single-type treating chamber performing the liquid treatment and/or the drying treatment on the substrate in the single-type treating method; and
   a first buffer unit disposed between the first treating part and the single-type treating chamber and temporarily storing a substrate which has been treated at the first treating part.

6. The substrate treating apparatus of claim 1, wherein the treating bath has an open top, and the moving unit is installed on a side portion of the treating bath.

7. The substrate treating apparatus of claim 6, wherein the moving unit has a reversed 'U' shape so that the moving unit may be installed on the side portion of the treating bath.

8. The substrate treating apparatus of claim 1, wherein the first treating part further comprises a lifting/lowering member to move the storage container rotated by the posture changing member in an up/down direction, and the lifting/lowering member is attachable/removable to/from the storage container.

9. The substrate treating apparatus of claim 8, wherein the second treating part further comprises a first buffer unit for temporarily storing a treated substrate which has been liquid treated at the first treating part, and
   wherein the substrate treating apparatus further comprises a transfer unit for transferring the treated substrate between the storage container and the first buffer unit.

10. The substrate treating apparatus of claim 9, further comprising a controller configured to control the transfer unit and the lifting/lowering member so that the lifting/lowering member upwardly may move the storage container and the treated substrate which is exposed to outside may be transferred to the first buffer unit from the storage container.

11. The substrate treating apparatus of claim 10, wherein the controller further configured to control the transfer unit so that a topmost substrate among the substrates stored at the storage container is transferred from the storage container and transferred to the first buffer unit.

12. The substrate treating apparatus of claim 11, wherein the controller controls the lifting/lowering member to move the storage container in an upward direction after the topmost substrate among the substrates is transferred from the storage container, so subsequent topmost substrate among the substrates stored in the storage container is exposed to the outside.

13. A substrate treating apparatus comprising:
   a batch-type treating chamber for performing a cleaning treatment on a plurality of substrates in a batch-type treating method;
   a single-type treating chamber for treating the substrates treated in the batch-type treating chamber, and performing a drying treatment on a single substrate in a single-type treating method; and
   a transfer unit for transferring the substrates between the batch-type treating chamber and the single-type treating chamber,
   wherein the batch-type treating chamber comprises:

a treating bath having a containing space to contain a treating liquid; and a posture changing member submerged in the treating liquid contained in the containing space and rotating a storage container having a storage space storing the substrates, and wherein the posture changing member comprises:

a rotation unit installable on the storage container and rotating the storage container; and a moving unit installed on the treating bath and moving the storage container installed on the rotation unit in a horizontal direction.

14. The substrate treating apparatus of claim 13, wherein the batch-type treating chamber further comprises a lifting/lowering member moving in an up/down direction the storage container rotated by the posture changing member.

15. A substrate treating apparatus comprising:

a first treating part performing a liquid treatment on a plurality of substrates in a batch-type treating method; and a second treating part performing a drying treatment on a single substrate in a single-type treating method, wherein the first treating part comprises:

a first load port unit loading only untreated substrates;

a batch-type treating chamber performing a cleaning treatment on the plurality of substrates in a batch-type treating method;

a first transfer module having a batch-hand to transfer the plurality of substrates from the first load port unit to the batch-type treating chamber; and a first buffer unit disposed between the batch-type treating chamber and the second treating part and temporarily storing the substrates, wherein the second treating part comprises:

a single-type treating chamber performing a drying treatment on a single substrate;

a second transfer module having a single-hand to transfer the single substrate from the first buffer unit to the single-type treating chamber; and a second load port unit unloading the single substrate treated at the single-type treating chamber, and wherein the first treating part comprises:

a treating bath including a treating liquid;

a storage container submerged in the treating liquid contained in a containing space and having a storage space for storing the substrates; and a posture changing member rotating the storage container submerged in the treating liquid, wherein the posture changing member comprises:

a rotation unit installable on the storage container and rotating the storage container; and a moving unit installed on the treating bath and moving the storage container, installed on the rotation unit in a horizontal direction.

16. The substrate treating apparatus of claim 15, wherein the single-type treating chamber is provided in a plurality, and at least some of the single-type treating chambers are placed stacked with the first buffer unit, and at least some other of the single-type treating chambers are stacked one above another.

* * * * *